United States Patent [19]
Kikuchi et al.

[11] Patent Number: 5,849,606
[45] Date of Patent: Dec. 15, 1998

[54] SEMICONDUCTOR DEVICE AND MANUFACTURING OF THE SAME

[75] Inventors: Hiroshi Kikuchi; Tetsuya Hayashida, both of Tokyo; Masakatsu Gotou, Atsugi, all of Japan

[73] Assignees: Hitachi, Ltd., Tokyo; Hitachi Hokkai, Hokkaido, both of Japan

[21] Appl. No.: 694,425

[22] Filed: Aug. 12, 1996

[30] Foreign Application Priority Data

Aug. 25, 1995  [JP]  Japan ................................. 7-240883

[51] Int. Cl.⁶ .......................... H01L 21/44; H01L 21/48; H01L 21/50
[52] U.S. Cl. ........................ 438/108; 438/118; 438/126; 438/127; 438/613
[58] Field of Search ...................... 257/778, 738, 257/737, 787; 438/108, 118, 126, 127, 613; 228/180.22

[56] References Cited

U.S. PATENT DOCUMENTS

| | | | |
|---|---|---|---|
| 5,454,160 | 10/1995 | Nickel | 257/778 |
| 5,532,187 | 7/1996 | Schreiber-Prillwitz et al. | 438/51 |
| 5,547,740 | 8/1996 | Higdon et al. | 228/180.22 |
| 5,619,070 | 4/1997 | Kozono | 257/778 |
| 5,647,123 | 7/1997 | Greenwood et al. | 257/787 |
| 5,659,203 | 8/1997 | Call et al. | 257/778 |
| 5,670,826 | 9/1997 | Bessho et al. | 257/778 |

FOREIGN PATENT DOCUMENTS

63-64055  12/1988  Japan .

OTHER PUBLICATIONS

Reinforcing Effect of Resin on High Reliability of Flip Chip Mounting, Tasao Soga et al, pp. 516–524, Proceedings of Japan Society for Electronics, Information and Telecommunication, C–11, vol. J73–C–11, No. 9, Issued Sep. 1990.

"Practical Study of VLSI Packaging Technology (Part 2)", pp. 173–178, Published May 31, 1993, NIKKEI BP Corp.

Primary Examiner—John F. Niebling
Assistant Examiner—David A. Zarneke
Attorney, Agent, or Firm—Fay, Sharpe, Beall, Fagan, Minnich & McKee

[57] ABSTRACT

A semiconductor device has a pellet at the upper surface of a substrate and connects the pellet with a plurality of connecting terminals formed of solder bumps. The connecting terminal group is arranged in the form of a plurality of annular lines in the periphery of the pellet, and a reinforcing resin layer is formed, in the connecting terminal group, of a resin filling a thinner space formed between the pellet and the substrate. At the time of forming the solder bumps, a cutout portion (a vacant area where no bumps are arranged) is formed in the connecting terminal annular line group by means of a cutout part opened at one side of the annular line group, and the reinforcing resin layer is also formed in the cutout portion. Since the air in the thinner space is perfectly exhausted by the effect of the connecting terminal annular line group cutout portion when the vacant area is filled with the reinforcing resin, the generation of an unfilled area in the reinforcing resin layer can be prevented.

8 Claims, 15 Drawing Sheets

PRIOR ART FIG. 8(b)

SEMICONDUCTOR DEVICE AND MANUFACTURING OF THE SAME

BACKGROUND OF THE INVENTION

The present invention relates to a semiconductor device wherein a semiconductor pellet (hereinafter referred to as a pellet or chip) is bonded on a substrate by a flip chip connection method, and more particularly to a technique which can be effectively used to manufacture a semiconductor device wherein a pellet comprising an integrated circuit is mechanically and electrically connected on a substrate by the controlled collapse bonding (hereinafter referred to as CCB) method.

The flip chip connection is a technique for connecting a pellet with its active element surface provided opposed to the substrate surface. In general, a bump is formed on the pellet with solder or the like and the pellet is arranged upside down for matching with the specified location of the substrate. Thereafter, these bump and pellet are mechanically and electrically connected at the same time with a connection terminal group which is formed by the fused bump. Since the bump can be arranged not only at the periphery of the pellet but also at the desired position of the pellet, 250 I/O ports can easily be obtained only by forming a 15×15 matrix.

Since reliability of the connecting terminals formed by bumps is determined by matching of coefficients of thermal expansion of pellet and substrate, silicon (Si) (which is also used for the pellet) or a material having a coefficient of thermal expansion similar to that of silicon (such as silicon carbide (SiC) or aluminum nitride (AlN)) is used as the substrate material. For instance, as the equation for expressing the thermal fatigue of metal, the Coffin-Manson's equation is widely known. For a combination not assuring thermal matching between the pellet and the substrate, reinforcement by resin is employed.

In the mounting of a computer circuit, it is essential to reduce the area occupied by the package in order to make mounting delays as short as possible. Therefore, a package having utilized flip chip connections has been developed because the package is as compact as the pellet size. As the package is explained above, there is provided a micro carrier for LSI chip (hereinafter referred to as MCC). That is, MCC is a package where pellets are flip-chip connected to the substrate by CCB utilizing solder bumps. In view of reserving thermal matching with a silicon pellet, Mullite ceramics is used for the substrate in this MCC.

Moreover, examples of the technique for expanding the operating life of connection at the connecting terminals utilizing CCB solder bumps by filling a thinner space between the pellet and the substrate with a reinforcing resin in the MCC are described in "Reinforcing Effect of Resin on High Reliability of Flip Chip Mounting" by Tasao Soga, et. al. on page 516 to 524, Proceedings of Japan Society for Electronics, Information and Telecommunication, C-11, Vol. J73-C-11, No. 9, issued in Sept., 1990, and the Published Japanese Patent Application No. Sho 6364055 (1988).

Moreover, an example of MCC is described in "Practical Study of VLSI Packaging Technology (Part 2)" on page 173 to 178, published on May 31, 1993 by NIKKEI BP Corp.

SUMMARY OF THE INVENTION

However, the inventors of the present invention have found a problem that an unfilled area is generated when reinforcing resin is injected into the thinner space between the pellet and the substrate in such a case that a plurality of annular connecting terminal groups are arranged at the peripheral part of the pellet in order to eliminate so-called active areas wherein active pellet elements are laid. If an unfilled area is generated within the reinforcing resin layer supplied, it will cause a disconnection failure or a short-circuit failure of the connecting terminals and therefore it will cause a considerable adverse effect on the reliability of the package and the semiconductor device. Therefore, when a reinforcing resin layer is formed in the thinner space between the pellet and the substrate, it is necessary to previously assure that there is no resin-unfilled area within the reinforcing resin layer.

It is therefore an object of the present invention to provide a semiconductor device which can prevent the generation of unfilled areas in the reinforcing resin layer which is formed when resin is supplied into a thinner space formed by the connecting terminal group between the pellet and the substrate.

The above-described and other objects and novel characteristics of the present invention will become apparent from a detailed description of the specification and the accompanying drawings.

Typical inventions disclosed in the present application will be outlined as follows.

Namely, in a method of fabricating a semiconductor device, a quadrangular semiconductor pellet is arranged on one main surface of a substrate and is mechanically and electrically connected by a plurality of connecting bump terminals. The connecting terminal groups are arranged in the form of a plurality of annular lines in the periphery of the semiconductor pellet and a reinforcing resin layer is formed by filling a thinner space formed by the connecting terminal groups between the semiconductor pellet and the substrate with the reinforcing resin. Further, a cutout part (vacant area where there is no bump electrode) is formed at a part of the annular line group (bump electrode array) in such a manner as communicating the annular line group in the outer and inner portions in the radius direction, on the occasion that a plurality of annular lines are formed corresponding to the periphery of the semiconductor pellet at any one of the main surfaces of the semiconductor pellet or substrate. Thereafter the bumps are heated and fused to form the connecting terminal group and the reinforcing resin is supplied, from the cutout part of the annular connecting terminal group or the part opposed to the cutout part, to the thinner space formed by the connecting terminal group between the semiconductor pellet and substrate.

In the above method, when the thinner space between the semiconductor pellet and the substrate is filled with the reinforcing resin from the side opposed to the cutout part of the annular line groups of the connecting terminals, the reinforcing resin penetrates into the existing area where many connecting terminal areas are erected and the absent area where there is no connecting terminals at the inside of the annular line groups, by the effect of capillarity of the thinner space depending on resin and interfacial tension (surface tension) between the semiconductor pellet and the substrate. In this case, since the existing area has a small resin filling volume, the resin having penetrated into the existing area reaches the boundary between the hollow part and the solid part of the cutout portion preceding the resin penetrating the absent area, and such resin temporarily stops at the boundary due to surface tension. During this temporary stop period, the resin having penetrated the absent area perfectly exhausts the air in the absent area through the cutout portion maintaining the aperture, to thereby prevent the generation of an unfilled area in the absent area. When the unfilled area is filled with the resin, the resin having stopped temporarily at the boundary of the cutout portion is combined with the resin filling the cutout portion. As a result, a reinforcing resin layer with no unfilled area is formed for the entire part of the existing area and absent area within the thinner space formed between the semiconductor pellet and substrate.

On the other hand, in the method explained above, when the thinner space formed between the semiconductor pellet and the substrate is filled with the reinforcing resin from the cutout portion of the annular line group of the connecting terminals, the reinforcing resin penetrates to fill the existing area where many connecting terminals are erected and the absent area where there is no connecting terminal at the inside of the annular line group, by the effect of the capillarity of the thinner space. In this case, the absent area has a large resin filling volume but the cutout portion works as the resin filling port of the absent area. Therefore, the resin penetrating the absent area reaches the opposite side faster than the resin penetrating the existing area. Therefore, the resin penetrating the absent area perfectly exhausts the air in the absent area from the space formed between the unfilled connecting terminals in the ambient existing area. As a result, the generation of an unfilled area within the absent area can be prevented. Moreover, since the reinforcing resin penetrates into the remaining existing area after the absent area is perfectly filled with the reinforcing resin, a reinforcing resin layer with no unfilled area is formed for the entire part of the existing area and absent area within the thinner space formed between the semiconductor and the pellet.

BRIEF DESCRIPTION OF THE DRAWINGS

FIG. 1 illustrates a semiconductor device as an embodiment of the present invention.

FIG. 2 illustrates a pellet used for the fabrication of a semiconductor device as an embodiment of the present invention.

FIG. 3 illustrates a substrate used for the fabrication of a semiconductor device as an embodiment of the present invention.

FIG. 4 illustrates a connecting terminal forming process for the fabrication as an embodiment of the present invention.

FIG. 5 illustrates a reinforcing resin filling apparatus used for a reinforcing resin filling process according to an embodiment of the present invention.

FIG. 6 illustrates a reinforcing resin filling process according to an embodiment of the present invention.

FIG. 7 illustrates a related art for explaining the effect of the reinforcing resin filling process.

FIG. 8 is a continuation of FIG. 7. FIG. 8(a) is a sectional view indicating the latter half of the resin filling process and FIG. 8(b) is a sectional view indicating the final part of the resin filling process.

FIG. 9 illustrates a ball grid array package of a semiconductor device as an embodiment of the present invention.

FIG. 10 illustrates a reinforcing resin filling process according to a second embodiment of the present invention.

FIG. 11 is a continuation of FIG. 10.

FIG. 12 illustrates a semiconductor device as a third embodiment of the present invention.

FIG. 13 illustrates a reinforcing resin filling process.

FIG. 14 illustrates a semiconductor device as a fourth embodiment of the present invention.

DESCRIPTION OF THE PREFERRED EMBODIMENTS

Figure 1A:
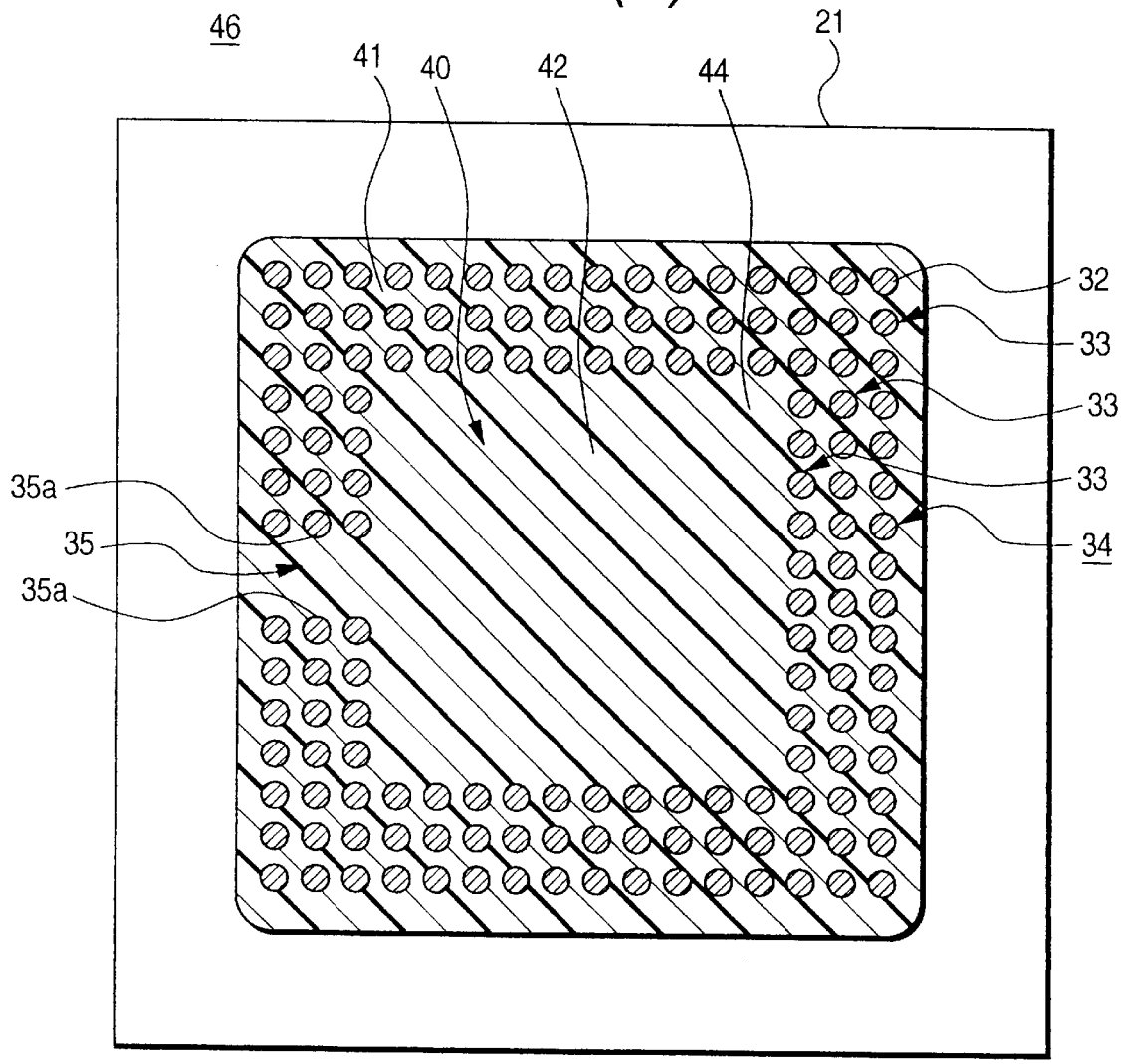
FIG. 1(a) is a sectional view along the line I—I of FIG. 1(b).
Figure 1B:
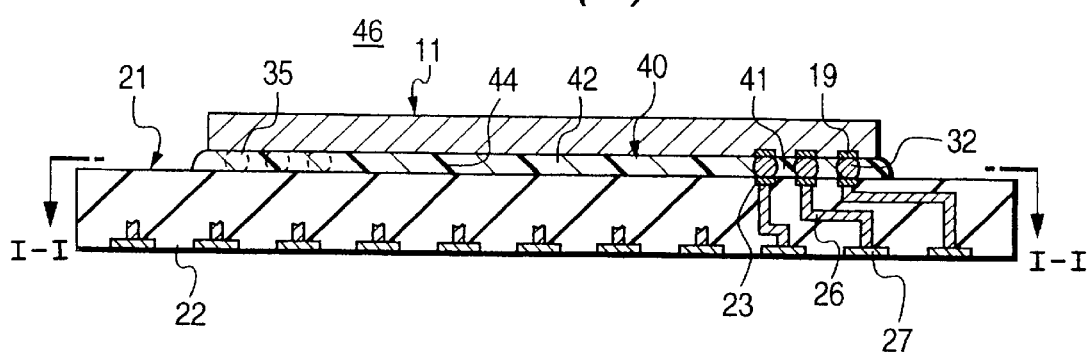
FIG. 1(b) is a cross-sectional view of FIG. 1(a) taken along line I'—I'.

FIG. 1 illustrates a semiconductor device as an embodiment of the present invention. FIG. 2 to FIG. 8 are explanatory diagrams showing a fabrication method and operations thereof.

A package of the semiconductor device in relation to the present invention is formed as MCC. That is, in the semiconductor device 46 shown in FIG. 1, a quadrangular silicon pellet 11 is arranged on one main surface (hereinafter referred to as the upper surface) of the substrate 21 and mechanically and electrically connected by a plurality of connecting terminals 32 formed by CCB from solder bumps. Moreover, these connecting terminal groups are arranged as annular lines in the periphery of the pellet 11 and the reinforcing resin layer 44 is formed by filling the thinner space formed by the connecting terminal groups formed between the pellet and the substrate with the reinforcing resin. A cutout portion 35 is formed at the center of a side of the quadrangular frame type annular connecting terminal line group 34 to communicate the internal and external sides of the radius direction of this annular line group 34, and the reinforcing resin layer 44 is also formed at this cutout portion 35.

This semiconductor device is fabricated by the following fabrication method. A method of fabricating this semiconductor device as an embodiment of the present invention will be explained hereinafter.

Figure 2A:
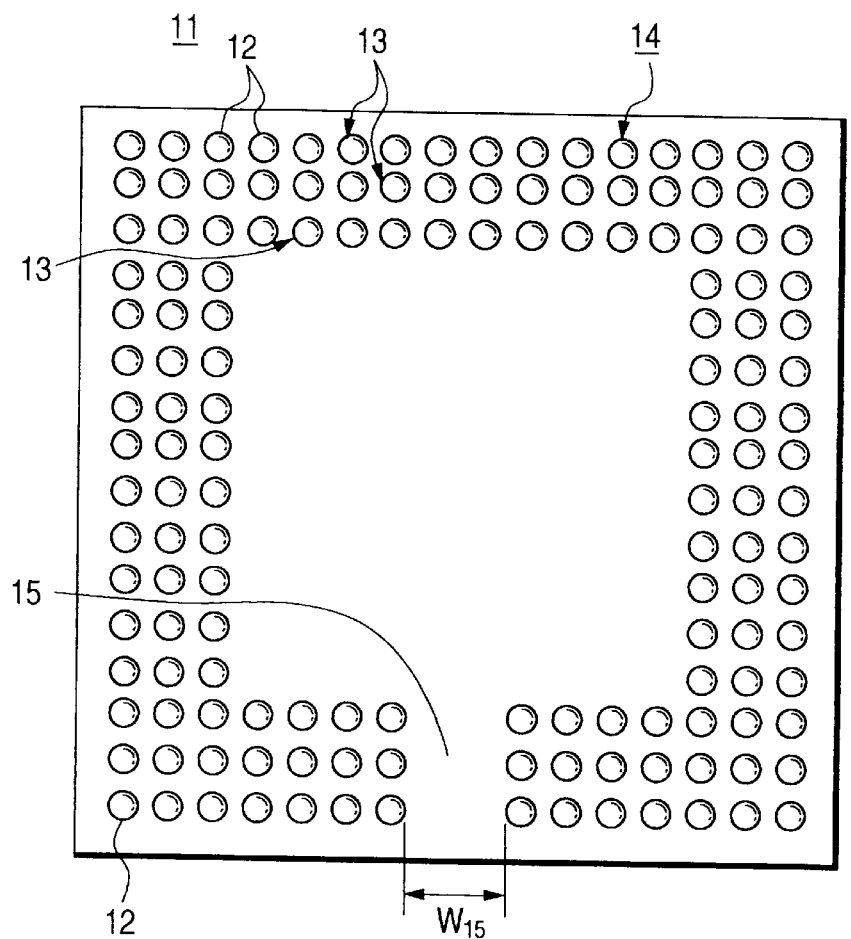
FIG. 2(a) is a bottom view and FIG. 2(b) is a cross-sectional view of the enlarged portion.
Figure 2B:
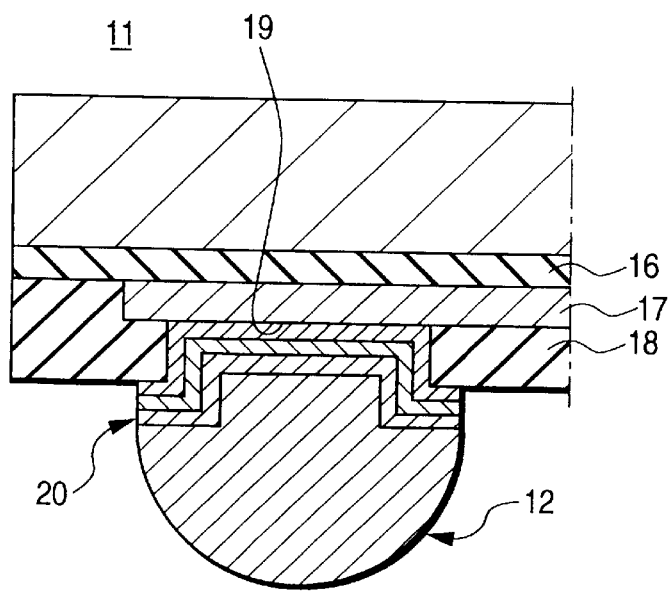

In this semiconductor device fabrication method, a pellet 11 shown in FIG. 2 is used. This pellet 11 is formed in the shape of a square flat plate utilizing silicon, and a plurality of lines (three lines in the example shown in the figure) of the annular solder bump line (hereinafter referred to as a bump line) formed by arranging many solder bumps 12 in the shape of the square external line are formed concentrically to the pellet 11, keeping equal intervals in the radius direction in the periphery of the main surface of the active element side of the pellet 11 where an active element such as a MOSFET or a bipolar transistor is formed (the main surface in the active area side, hereinafter referred to as the lower surface). In this embodiment, an input/output circuit is formed in the periphery of the semiconductor pellet where a solder bump is formed, and a logic circuit and a memory array or the like are formed at the center surrounded by the solder bump array. The solder bump 12 is formed almost semi-spherically using solder, and many solder bumps 12 are arranged serially on the line keeping the equal interval in the circumferential direction in each bump line 13. The pitch of adjacent solder bumps 12 and the pitch of the adjacent bump lines 13 are respectively designed to be two times the diameter of a solder bump 12, and the clearance between adjacent solder bumps is designed to be equal to the diameter of a solder bump 12. The square frame type annular solder bump line group (hereinafter referred to as bump line group) 14 formed of a plurality of bump lines 13 is arranged to avoid the active area (not illustrated) of the pellet 11.

At the center of one side of the bump line group 14, the annular bump line group cutout portion (hereinafter referred to as a bump line group cutout portion) 15 is formed in such a manner as to permit communication between the internal and external sides of the bump line group 14. An aperture $W_{15}$ Of the bump line group cutout portion 15 is set at least to a size that avoids contact of the reinforcing resins that oppose each other at the boundary thereof under the condition that the reinforcing resins in the filling process are temporarily stopped due to surface tension at the boundary of the hollow and solid portions of the annular line group cutout portion of the connecting terminal described later, at the time of filling the reinforcing resin explained later.

Pellets and solder bumps are fabricated in the form of wafers in the so-called pre-processing in the semiconductor device fabrication process. The pellet fabrication process will be briefly explained hereunder mainly based on the forming process of the solder bumps 12.

In the so-called pre-processing in the semiconductor device fabrication process, an integrated circuit (not illustrated) including semiconductor elements such as MOSFETs, bipolar transistors, etc., is fabricated in the form of wafer corresponding to each pellet 11. Next, electrical wiring 17 is formed, in the electrical wiring forming process, on an insulating film 15 of the integrated circuit. Formation of this electrical wiring 17 uses aluminum and is performed by a suitable thin film forming process such as sputtering or vacuum evaporation or the like, and a lithography process and an etching process. A passivation film 18 is deposited on the electrical wiring 17. In general, this passivation film 18 is constituted by a hard insulating film such as a silicon oxide film or silicon nitride film, etc. To this passivation film 18, many through holes are opened to the predetermined areas in the form of annular lines in the periphery of the pellet, keeping adequate intervals therebetween. At the bottom surface of each through hole opened, the predetermined electrical wiring 17 is exposed, whereby the through hole practically forms an electrode pad 19. This through hole can be opened selectively by the lithography process and the etching process.

Thereafter, in the solder bump forming process, a solder bump 12 is formed in each electrode pad 19 of the pellet 11 in electrical connection with each electrode pad 19, that is, the electrical wiring through a metallized layer 20 by the thin film forming process, the lithography process and the etching process, etc. For instance, the metallized layer 20 is constituted, from the side of electrode pad 19, by a first underlayer consisting of chromium, a second underlayer consisting of nickel, and a third underlayer consisting of gold. As the solder material of solder bump 12, Pb-2 wt %Sn having a melting point, for instance, of 320 to 325 *C., which is higher than that of the solder material used for mounting onto the mounting board of the semiconductor device, has been used.

As explained above, the wafer is divided into each pellet 11 in the dicing process. The pellet 11 having been diced is formed as a miniaturized flat plate corresponding to the pellet loading region on the substrate described later. For instance, the pellet 11 is formed as a square flat plate of 10 mm×10 mm.

Figure 3A:
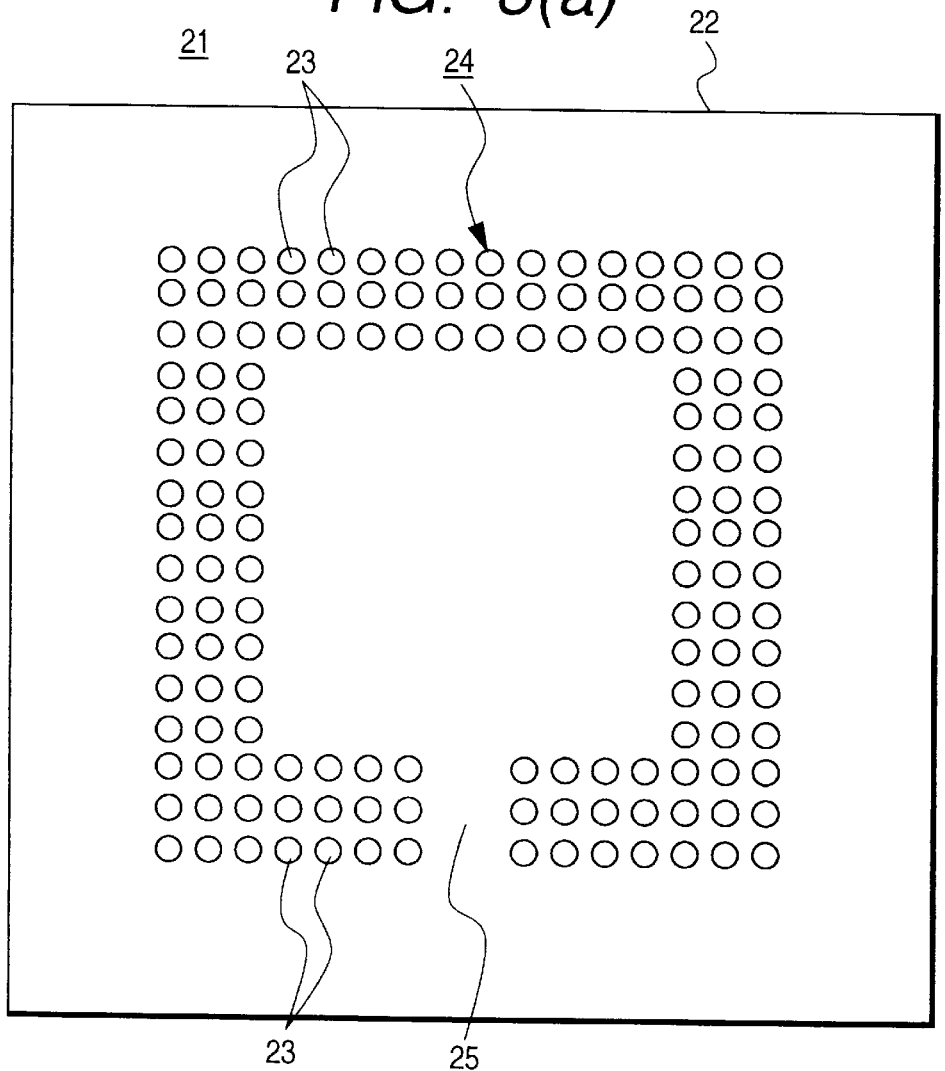
FIG. 3(a) is a plan view and FIG. 3(b) is a cross-sectional view of the enlarged portion.
Figure 3B:
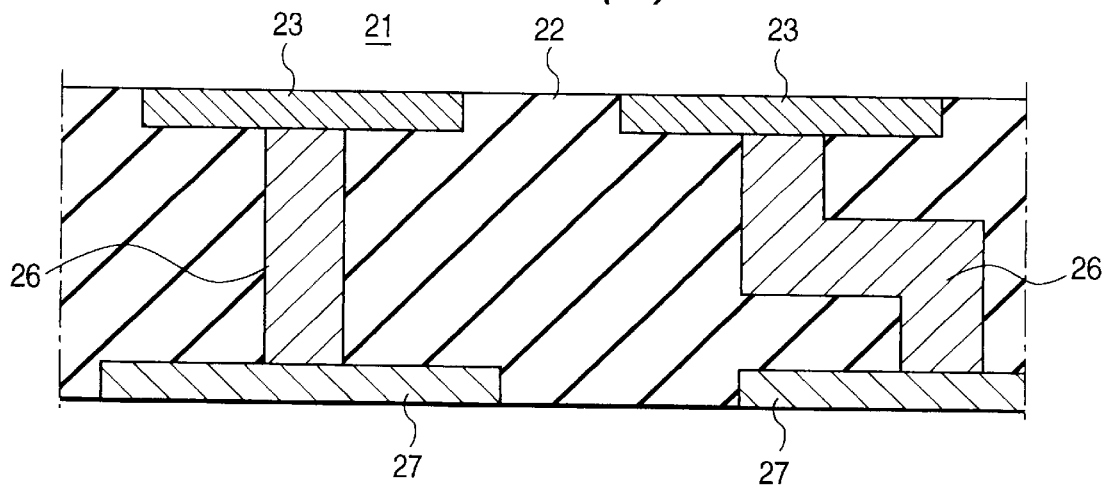

On the other hand, a substrate 21 shown in FIG. 3 is used in this semiconductor device fabrication method. The substrate 21 is provided with a base 22 formed of alumina ceramics and the base 22 is formed as a quadrangular flat plate which is sufficiently larger than the pellet 11. On one main surface (hereinafter referred to as the upper surface) of the base 22, many CCB pads 23 (hereinafter referred to as pads) are arranged and formed respectively corresponding to each solder bump 12 projected on the pellet 11. That is, the group of pads 23 is arranged in the form of an annular line group 24 of pads corresponding to the bump line group 14 to constitute the cutout portion 25 of the pad line group corresponding to the bump line group cutout portion 15. The surface of pad 23 is rendered in order to surely reserve wettability of solder for the solder bump 12.

At the lower surface of the base 22, external terminals 27 (only some of the terminals are illustrated) a corresponding number to the corresponding pads 23 are arranged in the form of a uniform matrix for the entire part of the base 22, and each external terminal 27 is connected to each pad 23 via each electrical wiring 26 for electrical independence. A bump for mounting (explained later) to mount the semiconductor device on the mounting board is formed to this external terminal 27.

Figure 4A:
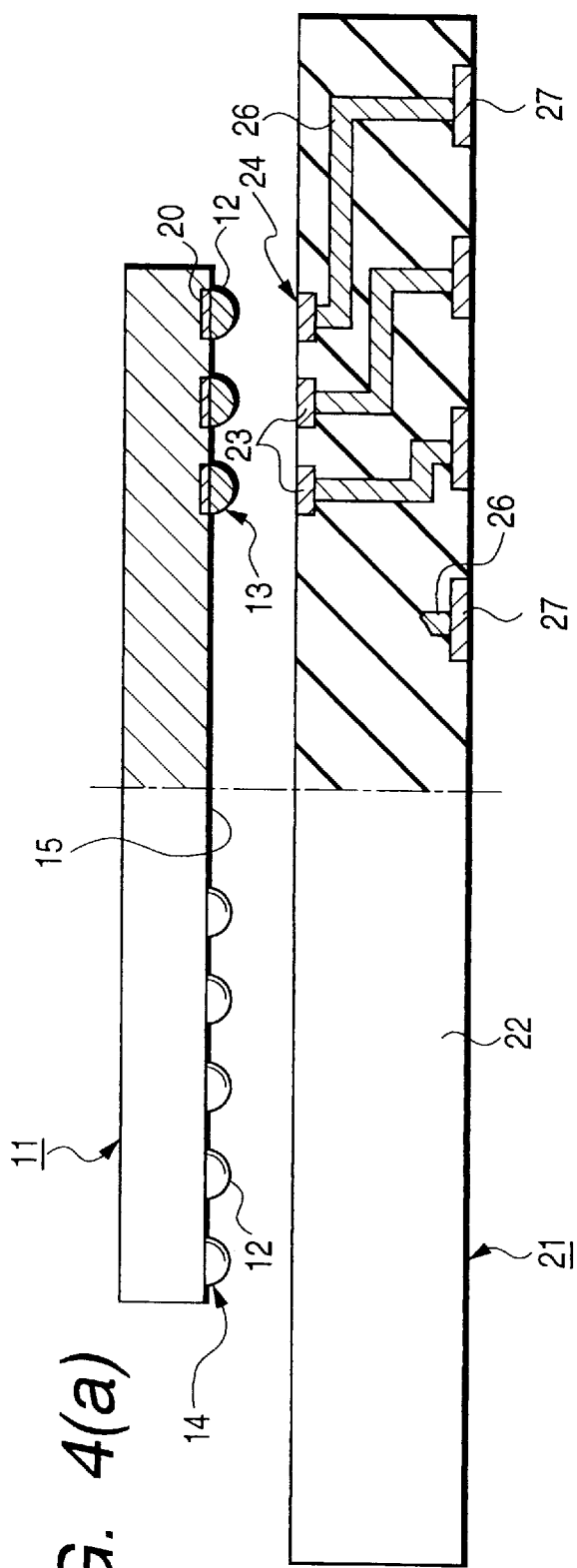
FIG. 4(a) is a partly cutout enlarged front elevation of a temporary bonding process for a pellet and a substrate.
Figure 4B:
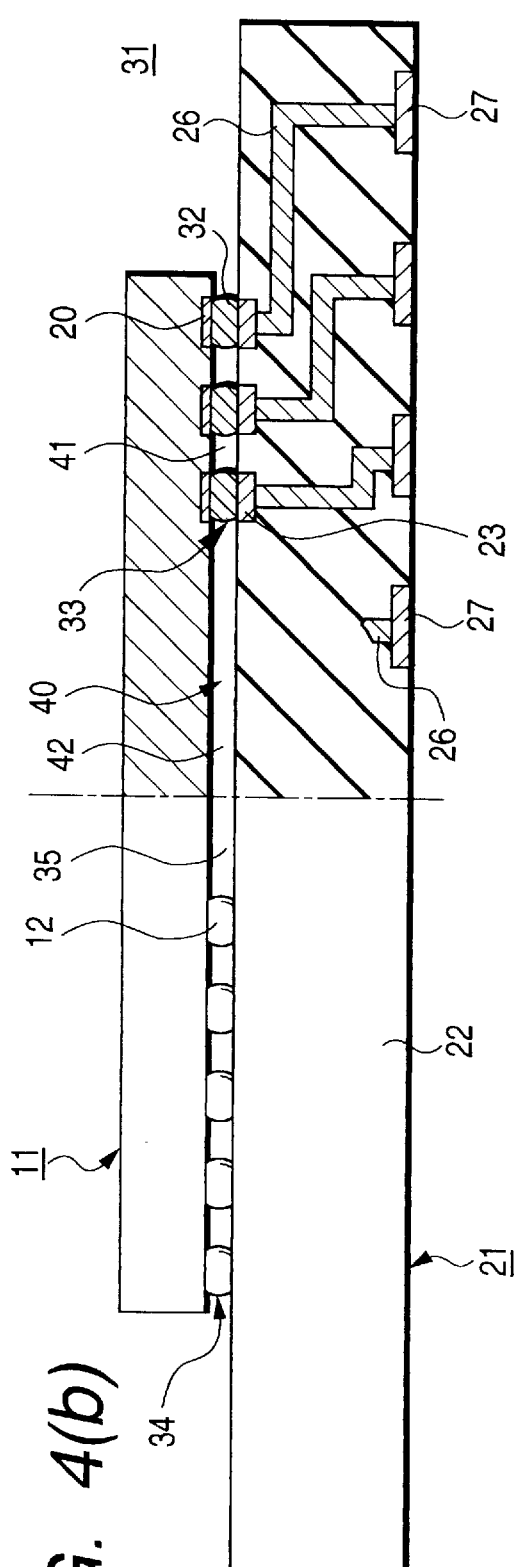
FIG. 4(b) is a partly cutout enlarged front elevation diagram after formation of a connecting terminal.

The substrate 21 fabricated as explained above is mechanically and electrically connected with the pellet 11 in the constitution explained above by CCB in the connecting terminal forming process. That is, as shown in FIG. 4(a), the pellet 11 is aligned with the substrate 21 and is temporarily bonded using flux or solder cream (not illustrated) under the face-down condition where each solder bump 12 of pellet 11 is respectively matched with each pad 23. Thereafter, each solder bump 12 is fused at the maximum temperature of 350° C., by executing adequate reflow process using a heating furnace or the like containing an ambient inactive gas (for example, nitrogen gas). With this reflow process, each connecting terminal 32 of each solder bump 12 is formed simultaneously as shown in FIG. 4(b). When this group of connecting terminals 32 is formed, the combining body 31 of the pellet 11 and substrate 21 can be fabricated. In this combining body 31, the pellet 11 is mechanically connected to the substrate 21 by means of the group of connecting terminals 32 and its integrated circuit is electrically connected to each external terminal 27 of the substrate 21 through electrode pad 19, connecting terminal 32, pad 23 and electrical wiring 26.

Since the connecting terminal 32 is formed by the fused solder bump 12, a group of the connecting terminals 32 forms annular lines of square external line type connecting terminals (hereinafter referred to as connecting terminal lines) 33 corresponding to the bump lines 13, and a plurality of connecting terminal lines 33 form the square frame type connecting terminal annular line group (hereinafter referred to as a connecting terminal line group) 34. In addition, at the center of a side of the connecting terminal line group 34, the connecting terminal line group cutout portion (hereinafter referred only to as a cutout portion) 35 corresponding to the bump line group cutout portion 15 is provided.

Moreover, since the connecting terminal 32 has almost a column shape where the center area in the height direction is swelled, the pellet 11 is lifted up to the predetermined height by means of the connecting terminal line group 34 from the upper surface of the substrate 21. Therefore, a wide and lower (from the floor surface to the ceiling surface) thinner space 40 having an area equal to that of the pellet 11 and a height equal to that of the connecting terminal 32 and is formed between opposed surfaces of the pellet 11 and substrate 21. This thinner space 40 is constituted by the area constituting the connecting terminal line group 34, namely the area 41 where many connecting terminals 32 are erected (hereinafter referred to as the existing area) and the area 42 at the internal side of the connecting terminal line group 34, namely the area where the connecting terminal 32 does not exist (hereinafter referred to as the absent area).

In the combining body 31 fabricated and constituted as explained above, the thinner space 40 formed between opposed surfaces of the pellet 11 and substrate 21 is filled with the reinforcing resin. Hereinafter, the reinforcing resin filling process and the effect thereof will be explained with reference to FIG. 5 to FIG. 8.

Figure 5A:
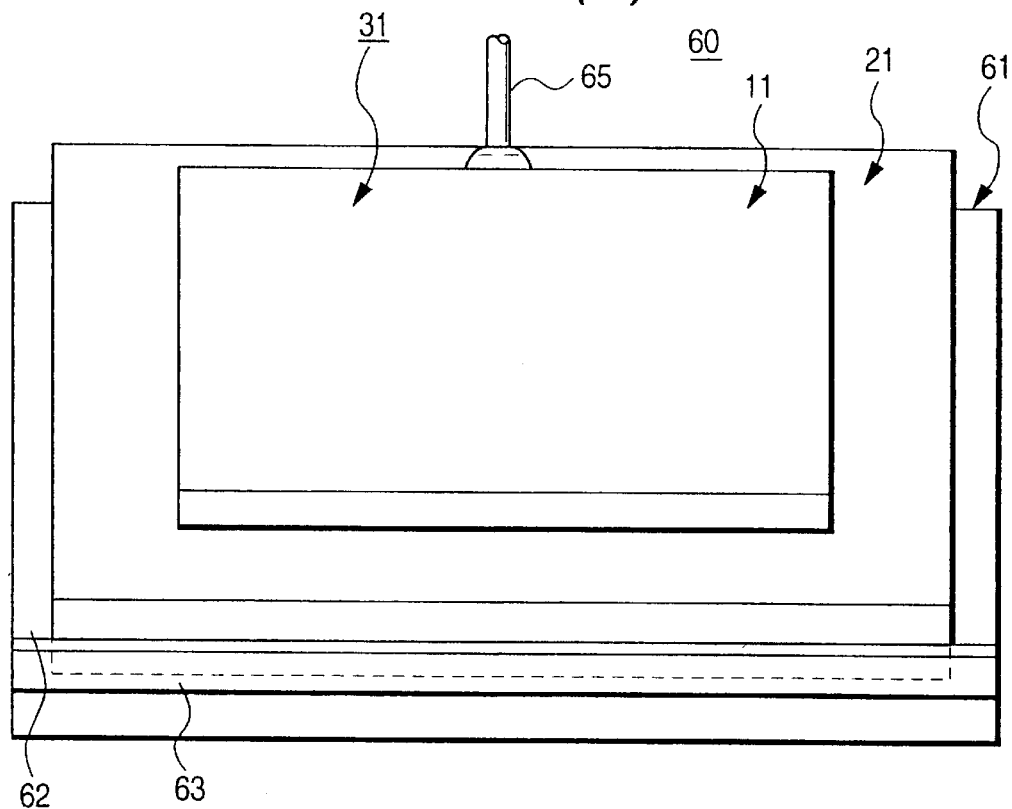
FIG. 5(a) is a front elevation and FIG. 5(b) is a cross-sectional view.
Figure 5B:
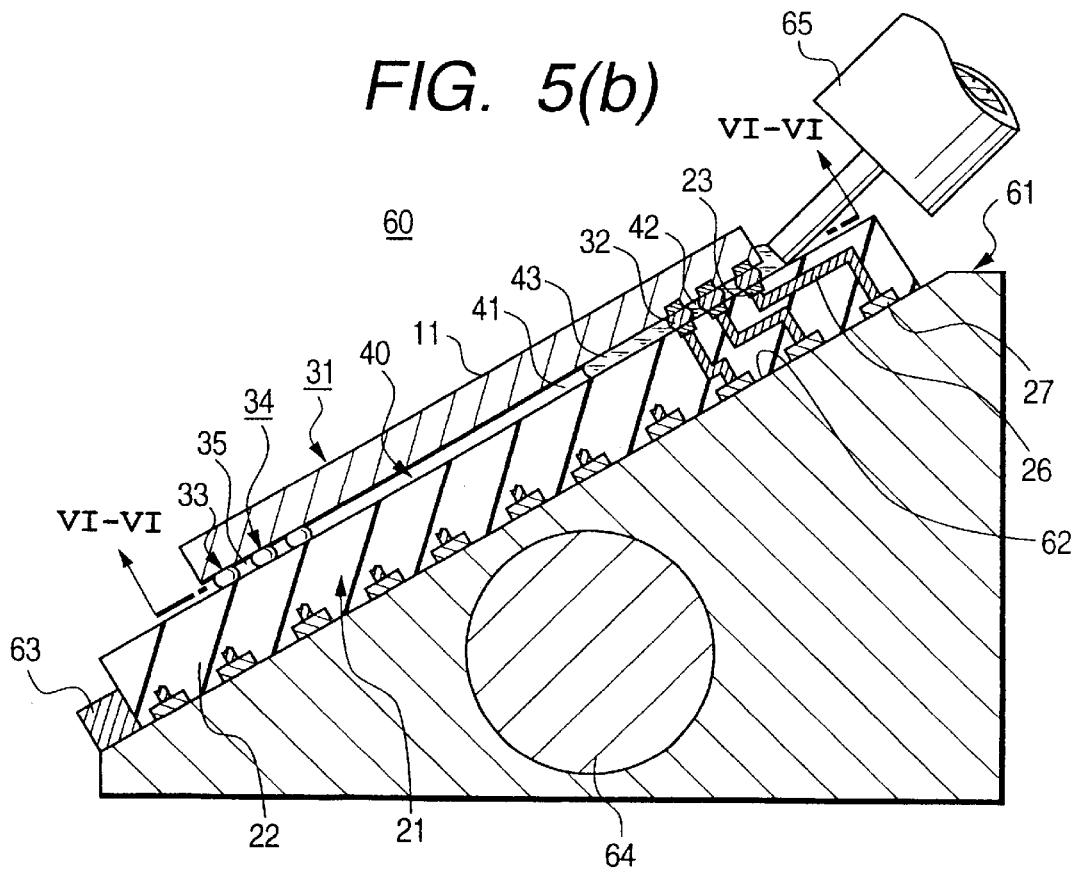

As shown in FIG. 5, a reinforcing resin filling apparatus 60 used in the reinforcing resin filling process comprises a working base and a dispenser. The working base 61 is provided with a holding surface 62 to hold the combining body 31 as a work and the holding surface 62 is inclined by 30 degrees with respect to the horizontal plane in terms of the design value. At the lower end part of the holding surface 62, a stopper 63 is projected. Moreover, a heater 64 is built in the working base 61 and this heater 64 is constituted to heat the combining body 31 held on the holding base 62 up to the predetermined temperature. The dispenser 65 is formed like a syringe and has a constitution to fill the thinner space 40 of the combining body 31 with the predetermined amount of the reinforcing resin at the constant flow rate and pressure under the condition that the resin is fused and heated up to the predetermined temperature to have a predetermined viscosity.

When the thinner space 40 between the pellet 11 and substrate 21 of the combining body 31 is filled with the reinforcing resin, the combining body 31 is put on the holding base 61 with the lower surface of substrate 21 placed in contact, and is then positioned and held by a stopper 63. In this case, the combining body 31 is arranged with the side where the cutout portion 35 is opened located at the lower side of the slope of the holding surface 62. The combining body 31 positioned and held on the working base 61 is heated by the heater 64 and controlled to the predetermined temperature. This control temperature is the heating temperature for maintaining the surface tension of the reinforcing resin to the optimum condition by keeping the fusing viscosity of the reinforcing resin and is set to 80° to 100° C.

Subsequently, the liquid reinforcing resin 43 (hereinafter referred to as the resin) filling the dispenser 65 fills the thinner space 40 of the combining body 31 positioned and held on the working base 61. In this case, the injection port of the dispenser 65 is applied to the center position opposed to the cutout portion 35 of one side located at the upper side of the combining body 31, and the resin is injected to the existing area 41 in this position. The injection rate of resin 43 by the dispenser 65 is controlled so that the resin effectively penetrates into the thinner space 40 depending on the capillarity and weight of the resin as will be explained later. Moreover, the amount of injection of resin 43 is set to a value a little larger than the volume of the thinner space 40. In addition, the injection temperature of resin 43 is controlled to 80° to 100° C.

As a material of the reinforcing resin, an epoxy resin having a viscosity of 50 to 200 Poise and a coefficient of thermal expansion of 2 to $9 \times 10^{-5}/°$ C. at the temperature of 25° C. (normal temperature) is used. Moreover, the epoxy resin is a rendered mixing of quartz filler for realizing a low expansion coefficient and also of polybutadiene rubber for realizing a low Young's modulus so that it is adjusted to have a coefficient of thermal expansion of about $3 \times 10^{-5}/°$ C. and a Young's modulus of about 1000 kgf/mm$^2$. Moreover, the epoxy resin is a rendered mixing of a thermosetting agent.

Figure 6A:
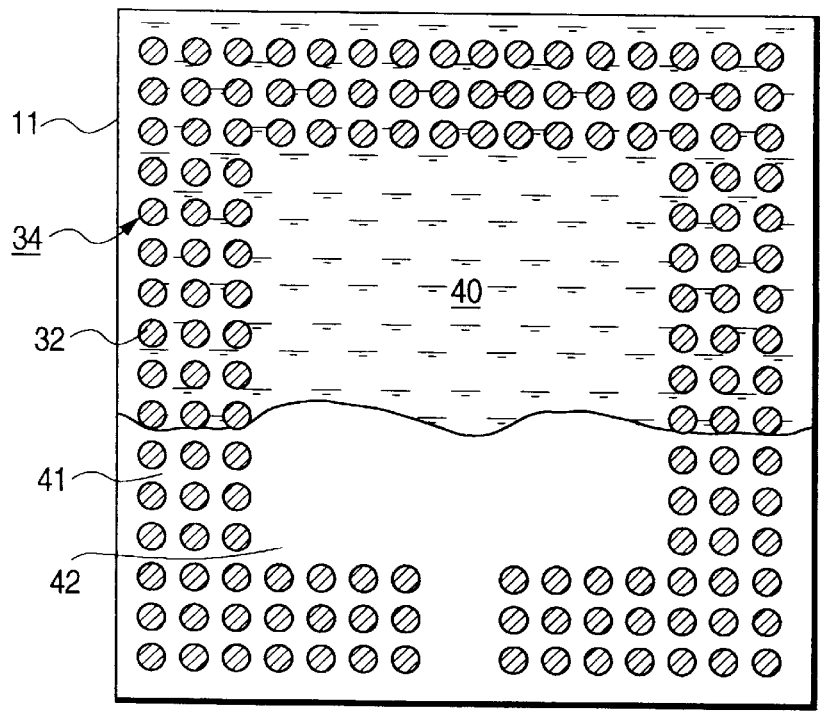
FIG. 6(a) is a sectional view corresponding to the view along the line VI—VI of FIG. 5(b) indicating the resin filling condition and FIG. 6(b) is a sectional view indicating the ending period of the filling process.

When the resin 43 using the material having the composition explained above is injected into the thinner space 40 of the combining body 31 by means of the dispenser 65 while it is heated up to 80° to 100° C. and fused, the resin penetrates, as shown in FIG. 6(a), to fill the existing area 41 where the connecting terminals 32 are erected and the absent area 42 where there is no connecting terminal 32 at the internal side of the connecting terminal line group 34, on the basis of the capillarity of the thinner space 40 depending on the interfacial tension between the resin 43 and pellet 11 and substrate 21 and the gravity working on the resin 43.

Figure 6B:
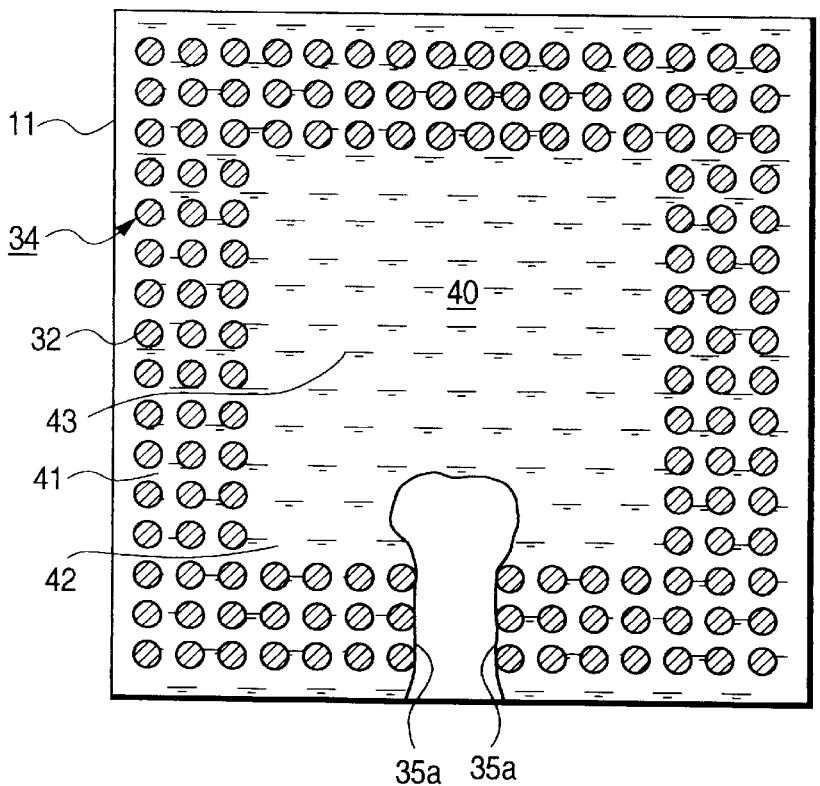

Since the existing area 41 has a small resin filling volume, the resin 43 having penetrated the existing area reaches, as shown in FIG. 6(b), a pair of boundaries 35a, 35a between the hollow part and solid part of the cutout portion 35 faster than the resin 43 penetrating the absent area 42 and is kept in a temporary stop condition by means of the surface tension at both boundaries 35a, 35a. During this temporary stop condition, the resin 43 having penetrated the absent area 42 perfectly pushes out the air in the absent area 42 through the cutout portion 35 maintaining its aperture. Therefore, the generation of an unfilled area in the absent area 42 can be prevented.

Finally, when the internal space of the cutout portion 35 is also filled with the resin 43, the resin 43 in the temporary stop condition at both boundaries 35a, 35a of the cutout portion 35 is combined with the resin 43 filling the internal space of the cutout portion 35. Therefore, the reinforcing resin layer 44 (refer to FIG. 1) having no unfilled area is formed for the entire part covering the existing area 41 and absent area 42 in the thinner space 40 between the pellet 11 and substrate 21. This resin filling work has been verified by experiment, utilizing a transparent material in place of the pellet 11.

The related art having an annular line group of the connecting terminals but no cutout portion has a problem in that an unfilled area is generated within the reinforcing resin layer. The mechanism of generating this problem will be explained with reference to FIG. 7 and FIG. 8.

Figure 7A:
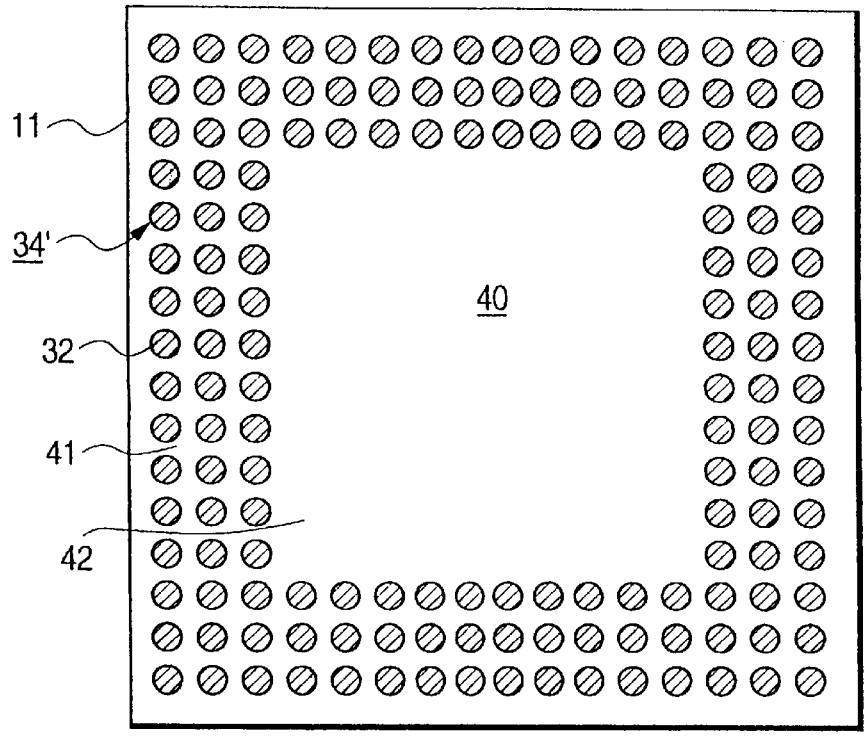
FIG. 7(a) is a sectional view along the line VII—VII of FIG. 5(b) indicating the condition before the filling of resin and FIG. 7(b) is a sectional view indicating the resin filling condition.
Figure 7B:
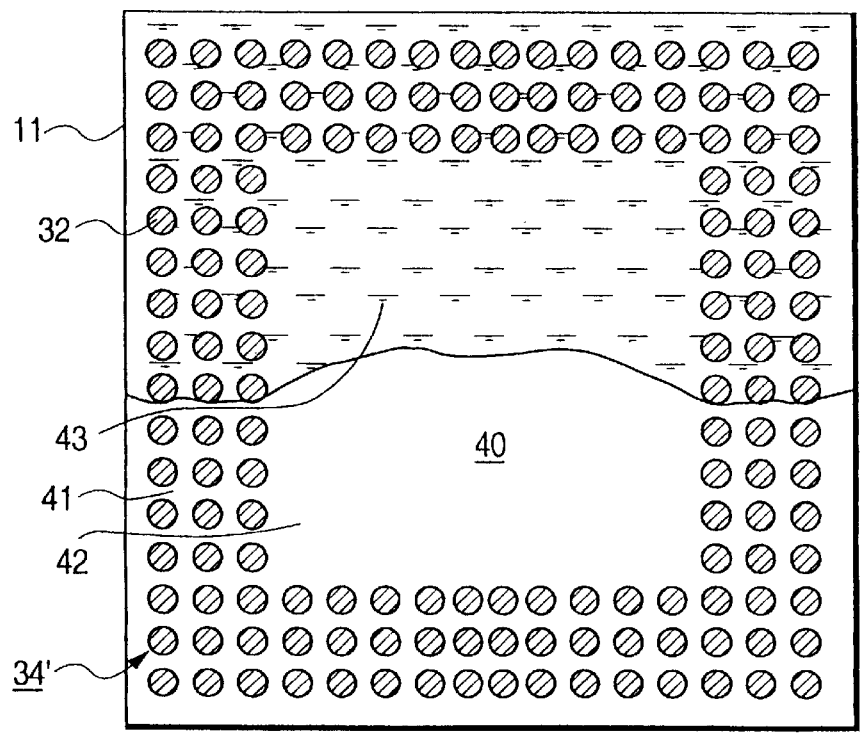

When the resin 43 is injected into the thinner space 40 of the combining body forming the connecting terminal line group 34' where the cutout portion is not opened as shown in FIG. 7(a), the resin 43 penetrates to fill the existing area 41 where the connecting terminals 32 are erected and the absent area 42 where there is no connecting terminal 32 at the inside of the connecting terminal line group 34' as shown in FIG. 7(b).

Figure 8A:
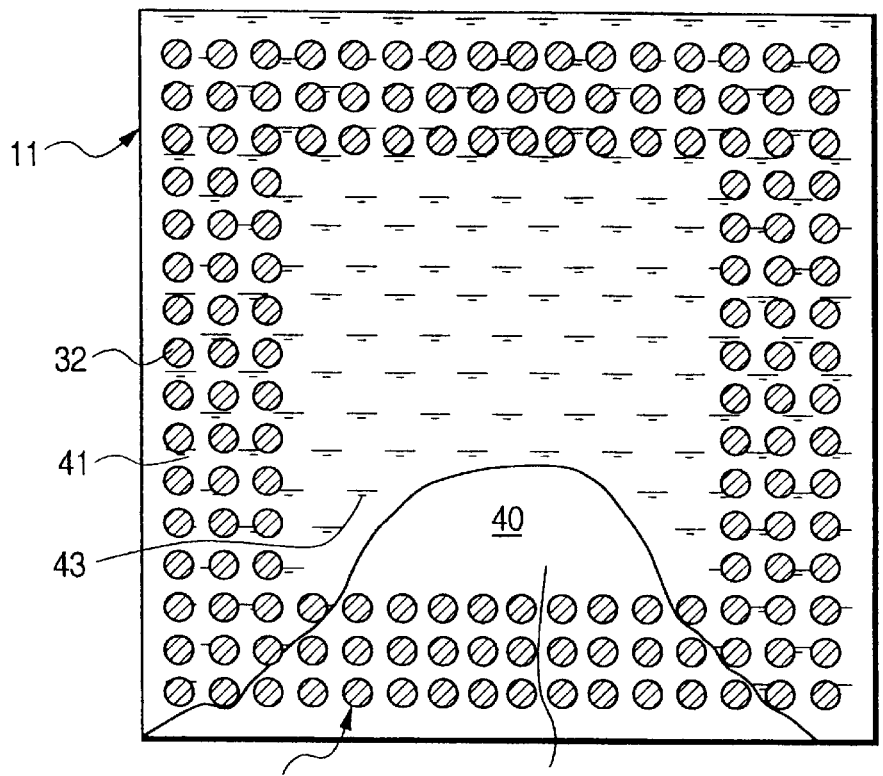
Figure 8A:
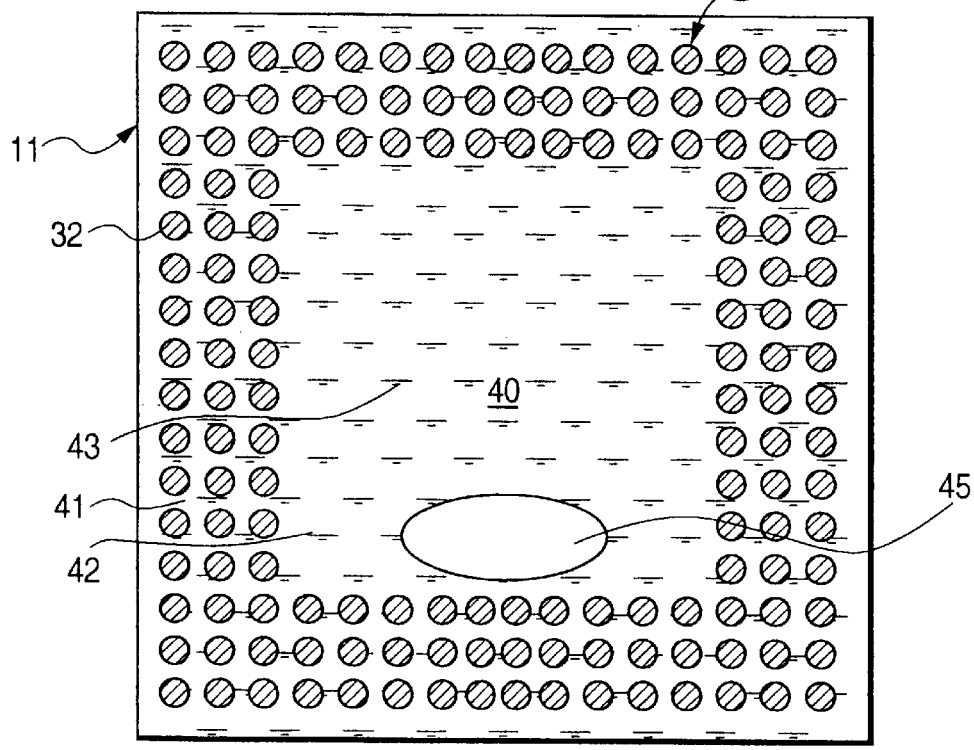

In this case, since the existing area 41 has a small resin filling volume, the resin 43 having penetrated the existing area 41 reaches the existing area 41 at the lower side of the connecting terminal line group 34' faster than the resin 43 penetrating the absent area 42, burying the existing area 41. When the existing area 41 of the connecting terminal line group 34' is filled with the resin 43, the absent area 42 is totally surrounded by the resin having filled the existing area 41 as it is closed perfectly as shown in FIG. 8(b). Therefore the air remaining in the absent area 42 is sealed and this sealed air brings about the unfilled area 45. This result has been verified by experiment, utilizing a transparent material in place of the pellet 11.

If the unfilled area is formed in the thinner space 45 between the opposed surfaces of the pellet and the substrate, a disconnection failure or a short-circuit failure of the connecting terminal is easily generated, adversely effecting the reliability of the package and of the semiconductor device. However, in this embodiment, since the formation of an unfilled area in the thinner space 40 between the opposed surfaces of the pellet 11 and substrate 21 can be prevented as explained previously, easier generation of a disconnection failure or a short-circuit failure of the connecting terminal can be prevented. As a result, reliability of the package and semiconductor device can be enhanced.

As explained above, the combining body 31 having the resin-filled thinner space 40, and no unfilled area, is heated and then thermally hardened by the heater 64 on the working base 61 under a temperature of 80° to 100° C. Thereafter, the combining body 31 is transferred to a heating furnace from the working base 61 and is then heated for about 180 minutes at a temperature of 150° C. for thermal hardening. With this thermal hardening, the reinforcing resin layer 44 for reinforcing the connecting terminal group 32 for mechanically and electrically connecting the pellet 11 and substrate 21 has been finally formed.

Figure 9A:
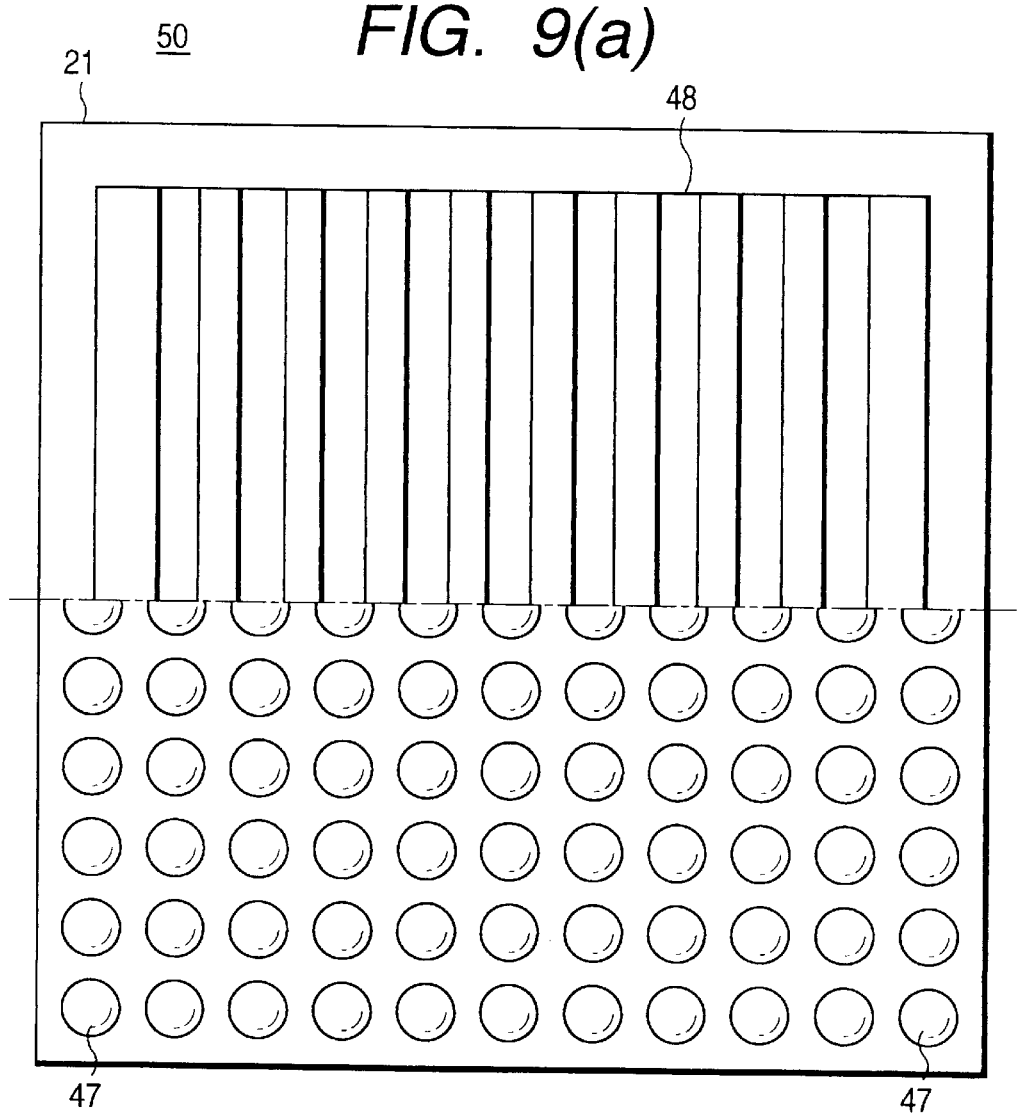
FIG. 9(a) includes the upper half as the plan view and the lower half as the bottom view.
Figure 9B:
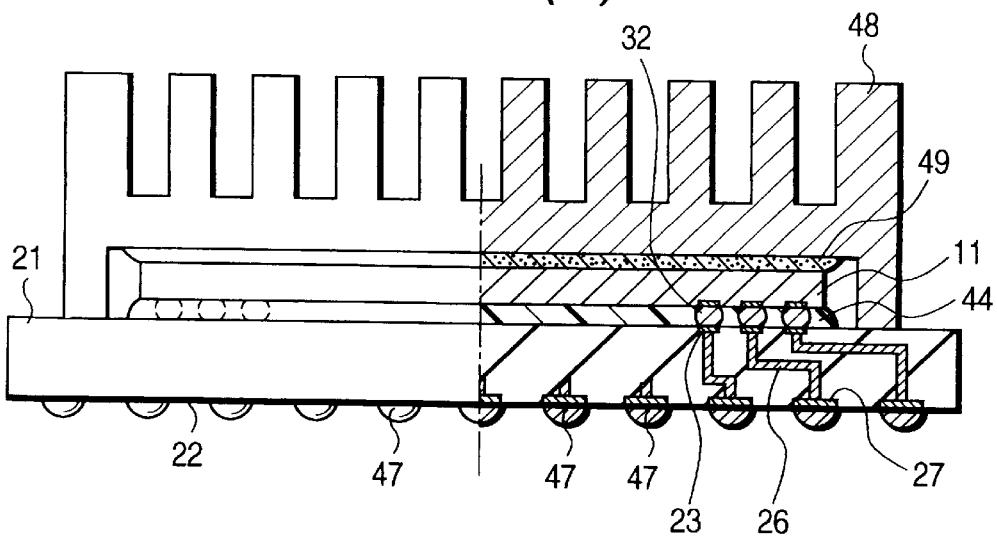
FIG. 9(b) is a partly cutout front elevation.

FIG. 9 shows an example where a semiconductor device 46 fabricated as explained above and illustrated in FIG. 1 is packaged in a ball grid array. That is, the solder bump constituting the external connecting terminal of the ball grid array (hereinafter referred to as a bump for mounting) 47 is formed, as shown in FIG. 9, at the external connecting terminal 27 at the lower terminal of the substrate 21 on which the reinforcing resin layer 44 is formed. The solder material of this bump for mounting preferably has a melting point, for example, of 183° C., which is lower than that (320° to 325° C.) of the solder material used to form the solder bump 12 for connecting terminal. Moreover, a heat radiating fin 48 is mounted covering the pellet 11 on the upper surface of the substrate 21, and the area between the upper surface of the pellet 11 and the lower surface of the heat radiating fin 48 is coated with a heat conductive grease 49.

According to a semiconductor device 50 of the ball grid array package fabricated as explained above and is shown in FIG. 9, since the bump for mounting 47 is arranged in the form of a matrix at the lower surface of the substrate 21, a pitch of the land in the mounting board (not illustrated) can be set large in the surface mounting package, and introduction of multiple pins can also be realized.

The embodiment explained above results in the following effects.

Since a cutout portion is formed, on the occasion of forming a plurality of solder bumps in the form of a plurality of annular lines corresponding to the periphery of the pellet at one main surface of the pellet, at a part of the bump annular line group in such a manner as to permit communication between the internal and external radius directions of the annular line group, thereafter the solder bump is heated and fused to form the connecting terminal group in order to mechanically and electrically connect the pellet and the substrate. Then, the reinforcing resin layer that has no unfilled area can be formed for the entire part of the existing area and absent area in the thinner space between the pellet and the substrate by filling the thinner space formed by the connecting terminal group between the pellet and the substrate with the reinforcing resin from the area opposed to the cutout portion of the connecting terminal annular line group. Easy generation of disconnection failures and short-circuit failures of the connecting terminals can be prevented and, as a result, the reliability of the package and semiconductor device can be enhanced.

Since the connecting terminal group and solder bumps need not be laid out in the active area at the center of the pellet because the connecting terminal group for mechanically and electrically connecting the pellet and the substrate and the solder bump group are arranged to form such connecting terminal group in the periphery of the pellet, the active area can be observed and a predetermined analysis and repair work can be performed, at the time of failure analysis and repair, without interference of the connecting terminal group and solder bump.

Since an adverse effect on the memory circuit by the α-ray of the connecting terminal group formed of the solder material can be previously avoided by arranging the connecting terminal group for mechanically and electrically connecting the pellet and the substrate in the periphery of the pellet and by arranging the memory circuit built in the pellet at the center thereof, a malfunction by the α-ray of the semiconductor device comprising the memory circuit can be prevented.

Since the reinforcing resin layer assures reinforcement of the connecting terminal group without inclusion of an unfilled area, severe matching of the coefficients of thermal expansion of the materials of the substrate and pellet (silicon) can be alleviated, whereby the substrate can be fabricated with a material of comparatively low price such as alumina ceramic or glass-impregnated epoxy resin or the like, to reduce the fabrication cost of the semiconductor device.

Since the reinforcing resin layer can seal with resin the connecting terminal group, the sealing structure for the semiconductor device as a whole can be eliminated to thereby reduce the fabrication cost of the semiconductor device.

Figure 10A:
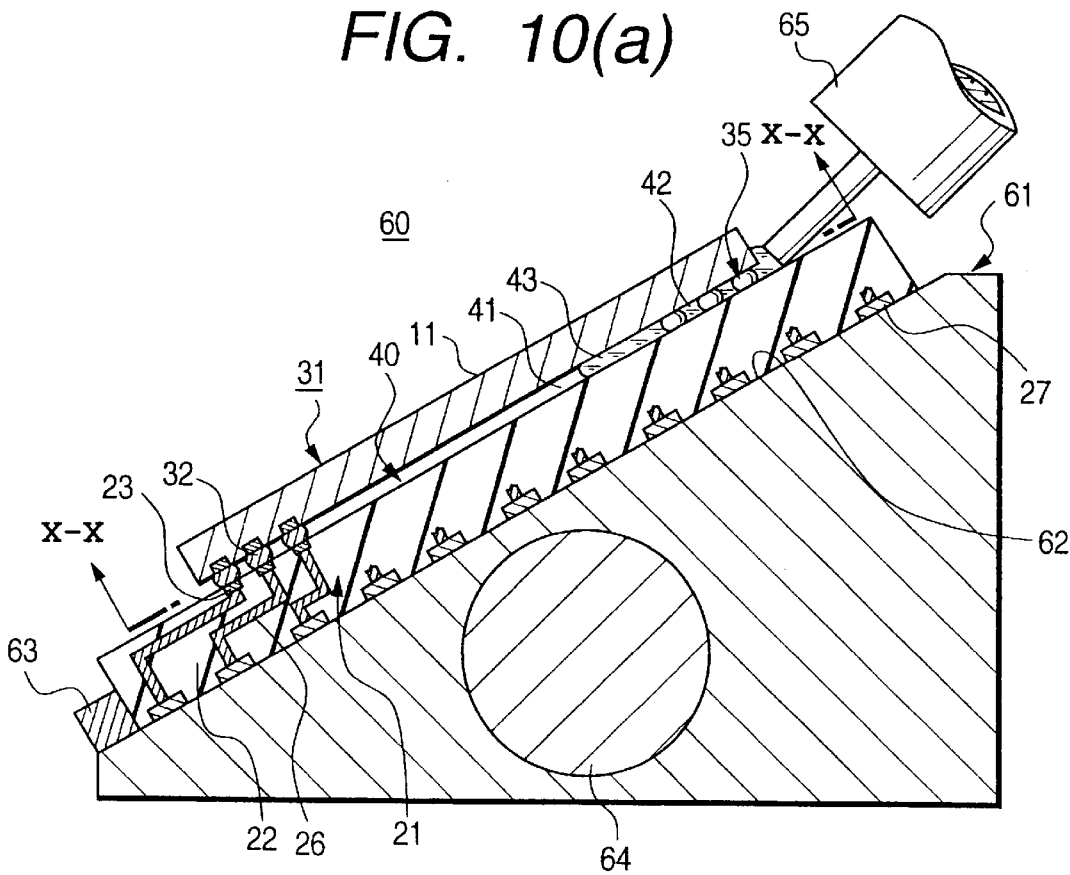
FIG. 10(a) is a cross-sectional view showing the resin filling process and FIG. 10(b) is a sectional view along the-line X—X of FIG. 10(a).
Figure 10B:
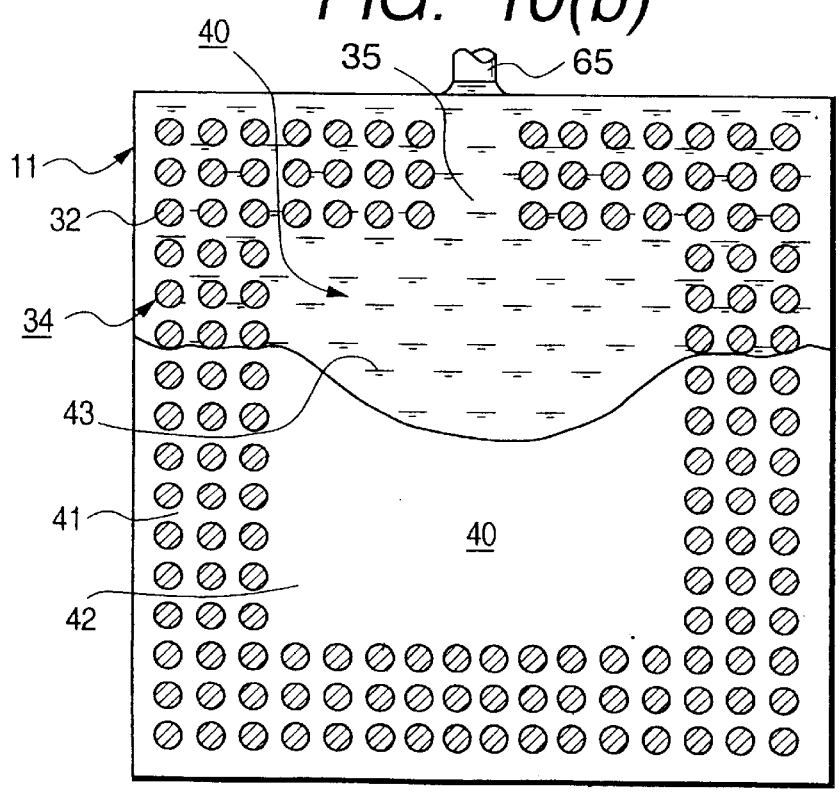
Figure 11A:
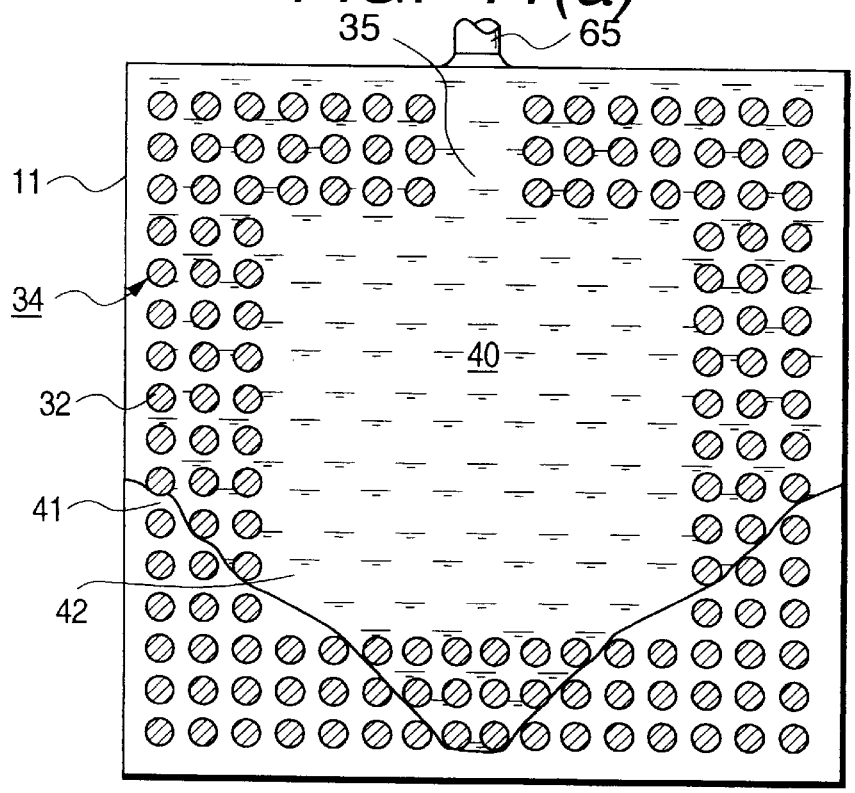
FIG. 11(a) is a sectional view showing the final part of resin filling and FIG. 11(b) is a sectional view showing the final part of the resin filling process.
Figure 11B:
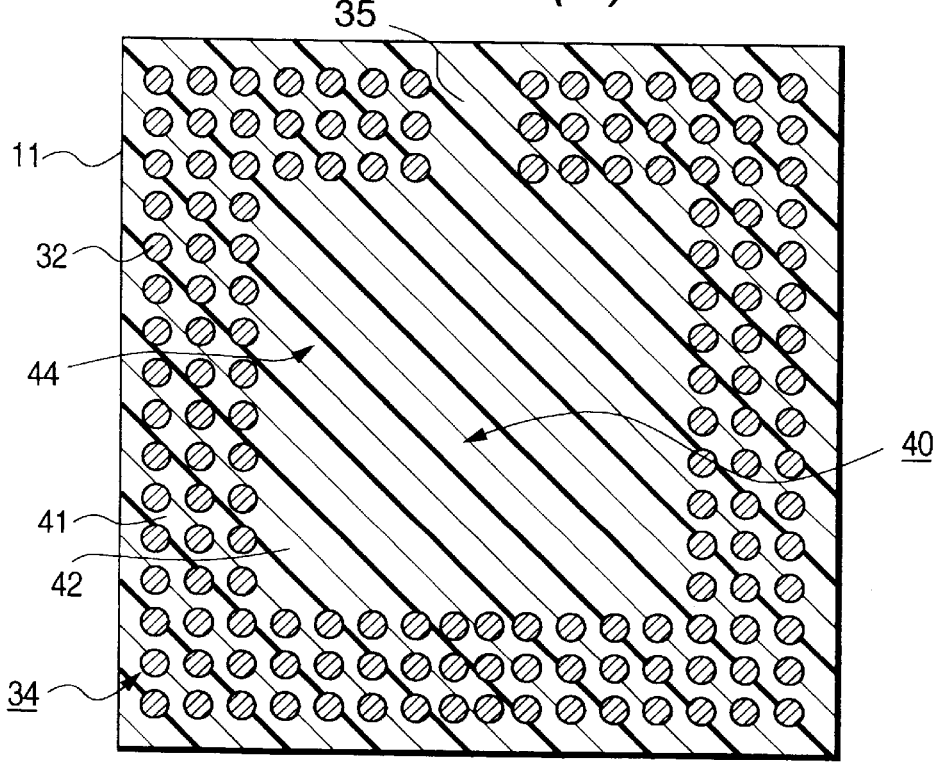

FIG. 10 and FIG. 11 are explanatory diagrams illustrating the reinforcing resin filling process in the fabrication method of the semiconductor device as the second embodiment of the present invention.

This second embodiment is different from the first embodiment in that, when the thinner space 40 in the combining body 31 positioned and held on the working base 61 is filled with the resin 43 filling the dispenser 65, the injection port of the dispenser 65 is applied to the cutout portion 35 at one side located at the upper side of the combining body 31, and the resin 43 is injected from the cutout portion 35 working as the filling port.

That is, as shown in FIG. 10(a), when the resin 43 is injected into the thinner space 40 from the cutout portion 35 by the dispenser under the condition that the resin is heated and fused, the resin 43 penetrates, as shown in FIG. 10(*b*), to fill the existing area 41 where the connecting terminals 32 are erected and the absent area 42 where there is no connecting terminals 32 at the inside of the connecting terminal line group 34, due to the capillarity of the thinner space 40 and depending on the interfacial tension between the resin 43 and the pellet 11 and substrate 21, and the gravity working on the resin 43. In this case, since the absent area 42 has a large volume for filling of resin but the cutout portion 35 works as the resin filling port of the absent area 42, the resin 43 penetrating the absent area 42 penetrates to the opposite side faster than the resin 43 penetrating the existing area 41 as shown in FIG. 11(*a*). Therefore, the resin 43 penetrating the absent area 42 perfectly exhausts the air in the absent area 42 from the unfilled space between the connecting terminals 32 in the existing area 41 surrounding the absent area 42. As a result, generation of an unfilled area in the absent area 42 can be prevented.

Moreover, since the resin 43 penetrates the existing area 41 after the absent area 42 is perfectly filled with the resin 43, the reinforcing resin layer 44, which has no unfilled area, is formed for the entire part of the existing area 41 and the absent area 42, as shown in FIG. 11(*b*), within the thinner space 40 provided between the pellet 11 and substrate 21. This resin filling process has been verified by experiment, using a transparent plate material in place of the pellet 11.

Figure 12A:
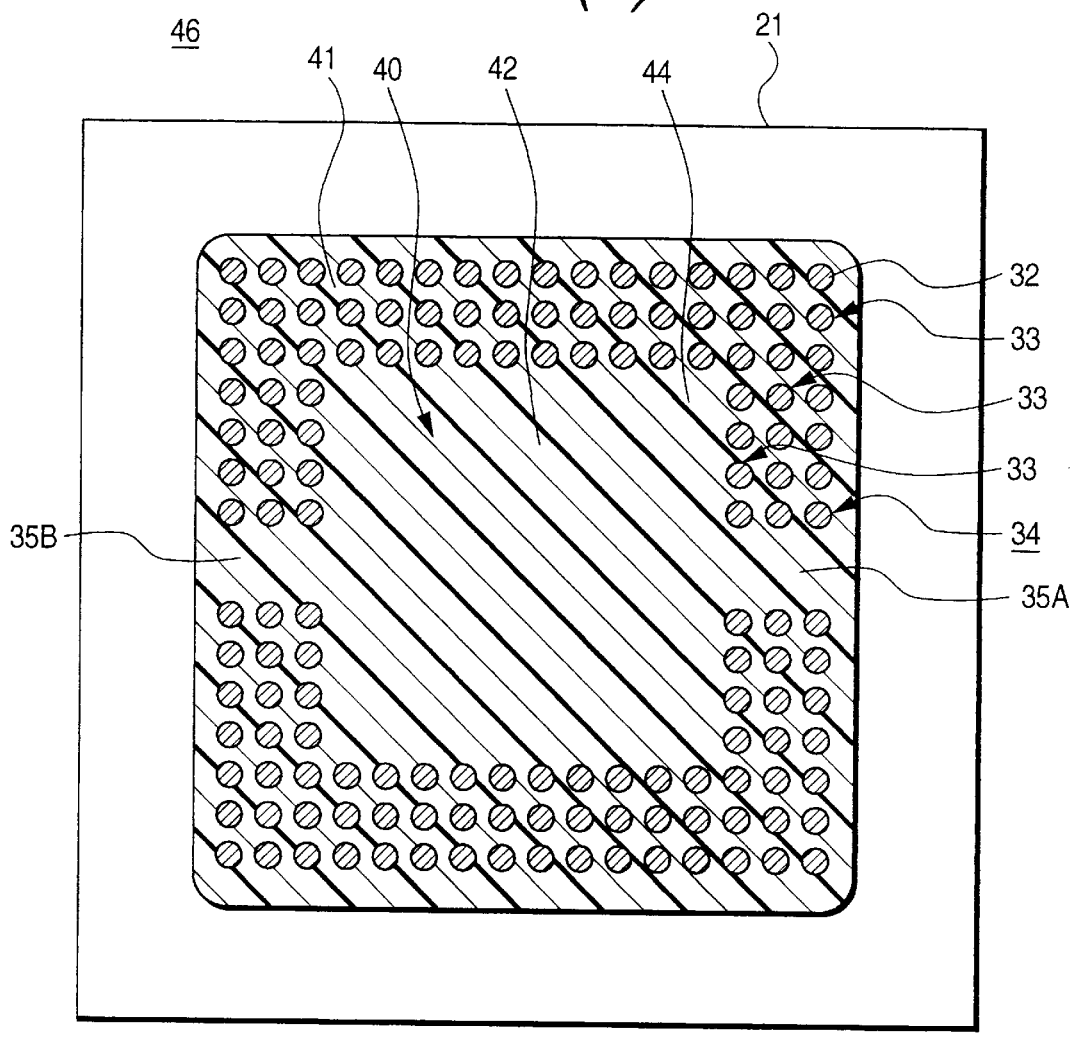
FIG. 12(a) is a sectional view along the line XII—XII of FIG. 12(b) and FIG. 12(b) is a cross-sectional view of FIG. 12(a).
Figure 12B:
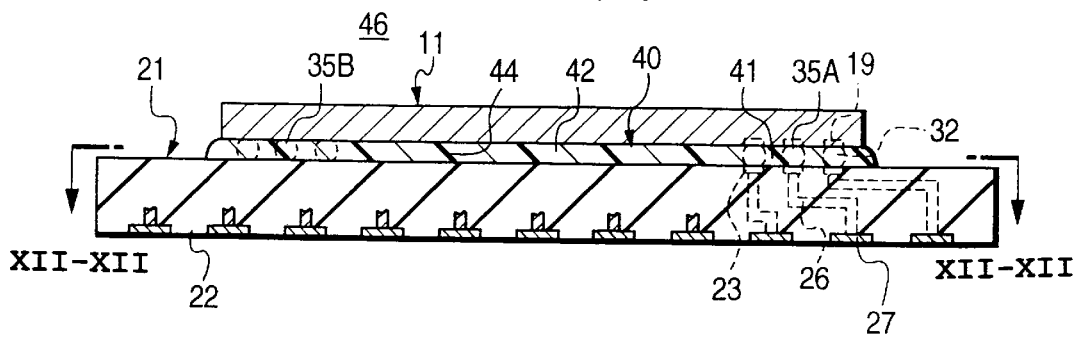
Figure 13A:
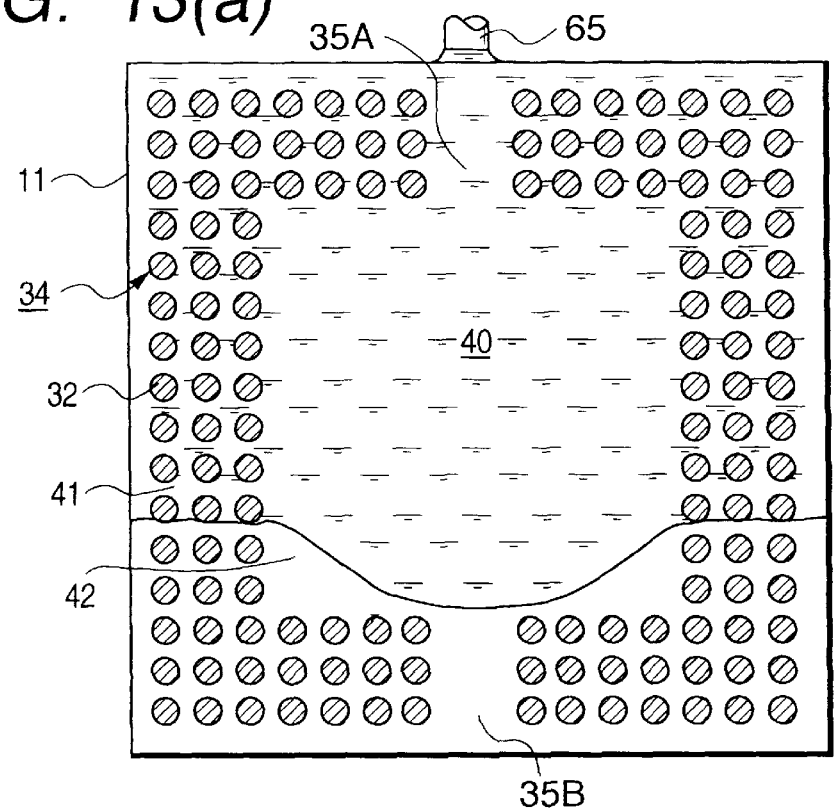
FIG. 13(a) is a sectional view corresponding to FIG. 6(a) showing the resin filling process and FIG. 13(b) is a sectional view showing the final part of the resin filling process.
Figure 13B:
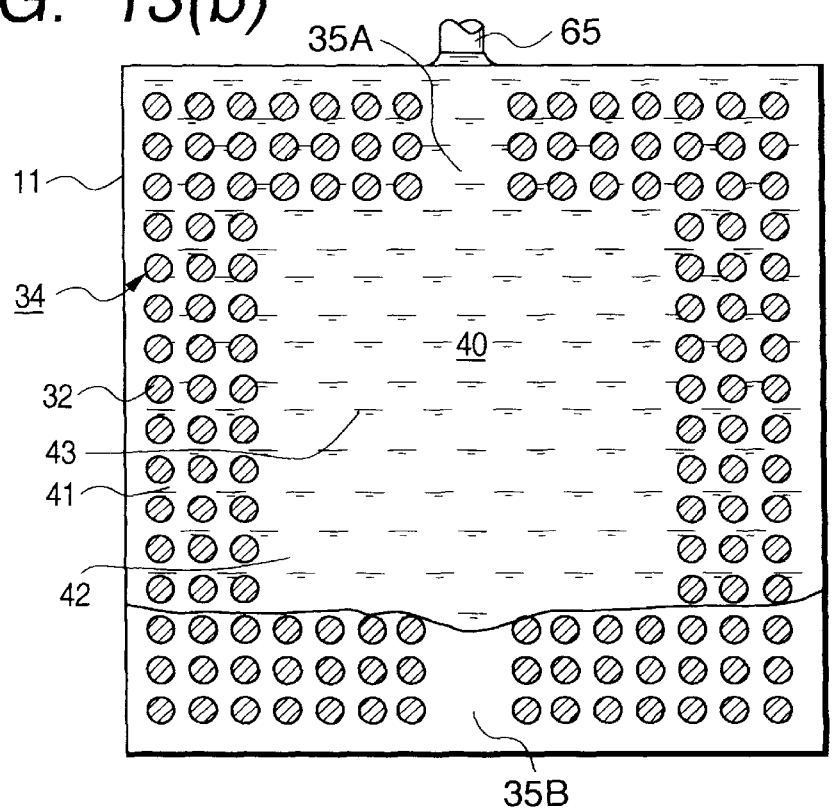

FIG. 12 illustrates a semiconductor device as a third embodiment of the present invention. FIG. 12(*a*) is a sectional view along the line XII—XII of FIG. 12(*b*). FIG. 12(*b*) is a cross-sectional view of FIG. 12(*a*). FIG. 13 is an explanatory diagram showing the reinforcing resin filling process in the fabrication method.

The semiconductor device of the embodiment 1 is different from that of the third embodiment in that a pair of cutout portions 35A and 35B are respectively arranged at a pair of positions which are opposed to each other on both sides of the center of the connecting terminal line group 34.

In the reinforcing resin filling process of the semiconductor device fabrication method, when the thinner space 40 of the combining body 31 positioned and held on the working base 61 is to be filled with the resin 43 filling the dispenser 65, the injection port of the dispenser 65 is applied to the cutout portion 35A located at the upper side of the combining body 31 (hereinafter referred to as the upper side cutout portion), and the resin 43 is injected from the upper side cutout portion 35A working as the filling port.

When the resin 43 is injected, under the condition that it is heated and fused, to the thinner space 40 from the upper side cutout portion 35A from the dispenser 65, the resin 43 penetrates, as shown in FIG. 13(*a*), to fill the existing area 41 where the connecting terminals 32 are erected, and the absent area 42 where there are no connecting terminals at the inside of the connecting terminal line group 34, due to the capillarity of the thinner space 40 and gravity. In this case, the absent area 42 has a large volume for resin 43 but the upper side cutout portion 35A works as the resin injecting port of the absent area 42. Therefore, as shown in FIG. 13(*b*), the resin 43 penetrating the absent area 42 penetrates to the opposite side faster than the resin 43 penetrating the existing area 41. Accordingly, the resin 43 penetrating the absent area 42 perfectly exhausts the air in the absent area 42 from the unfilled space between the connecting terminals 32 in the existing area 41 surrounding the absent area 42 and the lower side cutout portion 35B. As a result, generation of an unfilled area in the absent area 42 can be prevented.

Therefore, the reinforcing resin layer 44, which has no unfilled area, can be formed, as shown in FIG. 12, for the entire part of the existing area 41 and absent area 42 within the thinner space 40 provided between the pellet 11 and substrate 21, when the resin 43 penetrates the existing area 41 after the absent area 42 is perfectly filled with the resin 43. This resin filling process has been verified by experiment, using a transparent plate material in place of the pellet 11.

Even if the resin 43 penetrating the existing area 41 reaches a pair of boundaries of the hollow and solid portions of the lower cutout portion 35B faster than the resin 43 penetrating the absent area 42, the resin 43 is temporarily stopped at both boundaries due to surface tension. Therefore, the lower cutout portion 35B is never closed. That is, since the air exhausting function by the lower side cutout portion 35B is assured up to the final stage, the resin 43 penetrating the absent area 42 perfectly exhausts the air in the absent area 42 through the lower side cutout portion 35B maintaining the aperture, to thereby prevent the generation of an unfilled area in the absent area 42. When the space at the inside of the lower side cutout portion 35B is also filled finally with the resin 43, the resin 43 in the temporary stop condition at both boundaries of the lower side cutout portion 35 is also combined with the resin 43 filling the internal space of the lower side cutout portion 35B, whereby, as shown in FIG. 12, the reinforcing resin layer 44 is formed for the entire part of the existing area 41 and absent area 42 within the thinner space 40 provided between the pellet 11 and substrate 21, with no unfilled area. This resin filling process has also been verified by experiment, using a transparent plate material in place of the pellet 11.

Figure 14A:
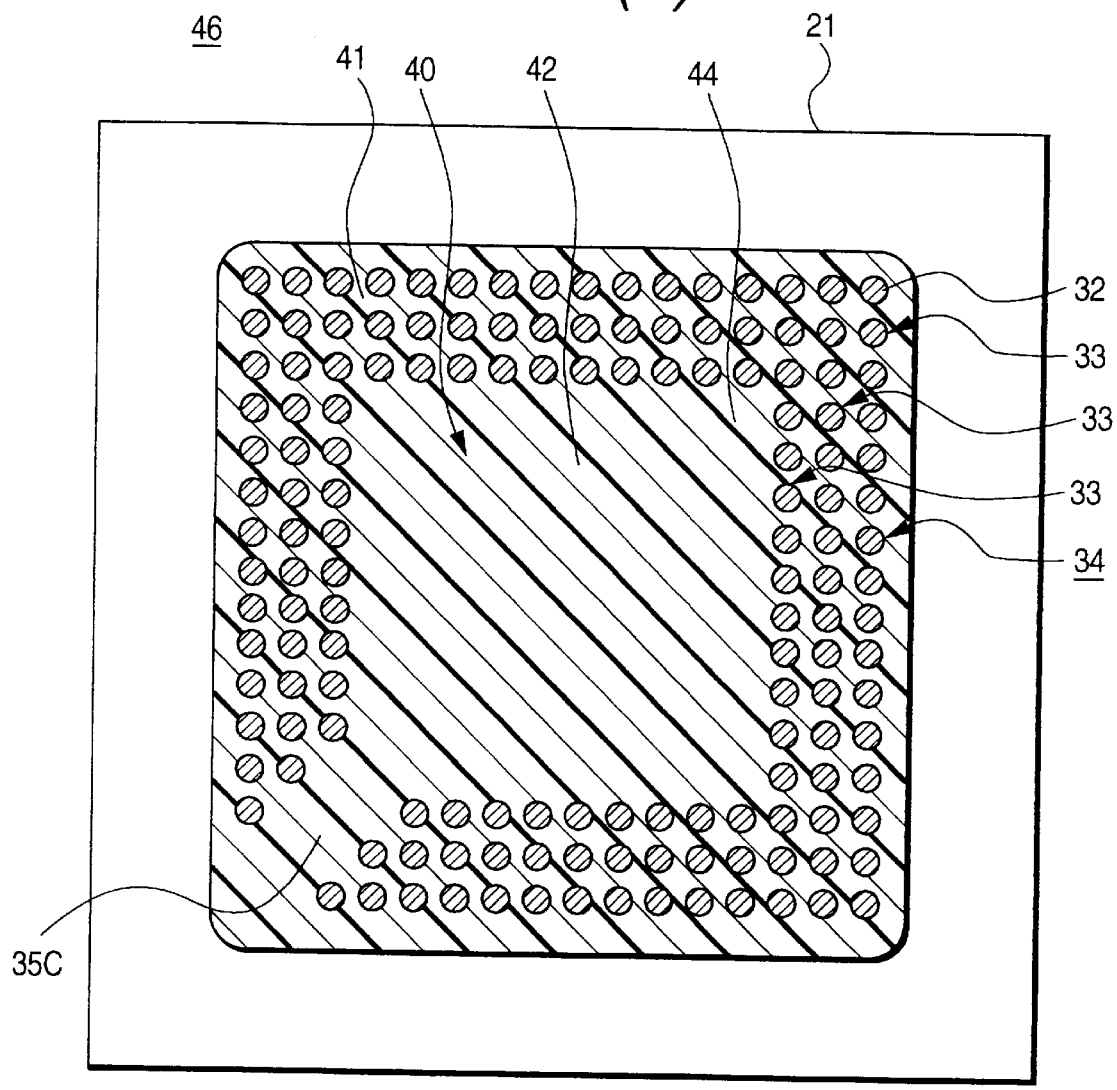
FIG. 14(a) is a sectional view along the line XIV—XIV of FIG. 14(b) and FIG. 14(b) is a cross-sectional view of FIG. 14(a).
Figure 14B:
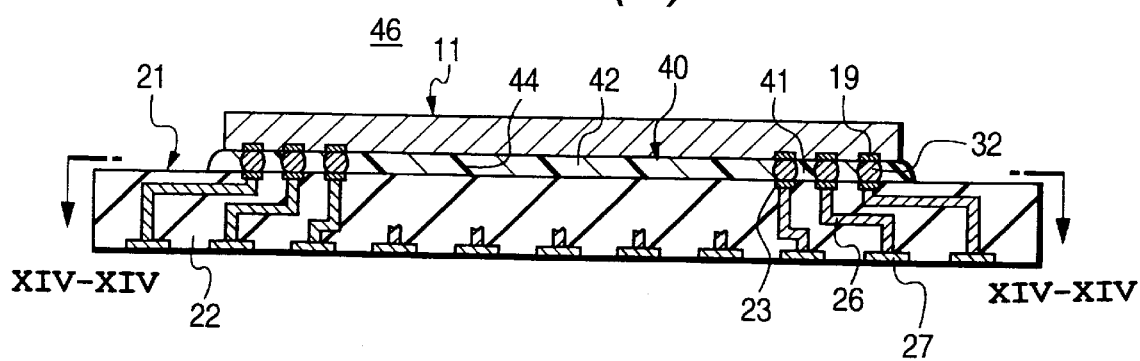

FIG. 14 illustrates a semiconductor device as the fourth embodiment of the present invention. FIG. 14(*a*) is a sectional view along the line XIV—XIV of FIG. 14(*b*). FIG. 14(*b*) is a cross-sectional view of FIG. 14(*a*).

The fourth embodiment is different from the first embodiment in that the connecting terminal annular line group cutout portion 35C is arranged at one corner of the connecting terminal annular line group 34. The effect of the fourth embodiment is similar to that of the first embodiment. The cutout portion 35C at the corner may also be arranged respectively at a pair of opposing corners.

The present invention has been described on the basis of the preferred embodiments thereof, but the present invention is of course not limited to above embodiments, allowing various changes and modifications without departure from the scope of the claims.

Figure 15A:
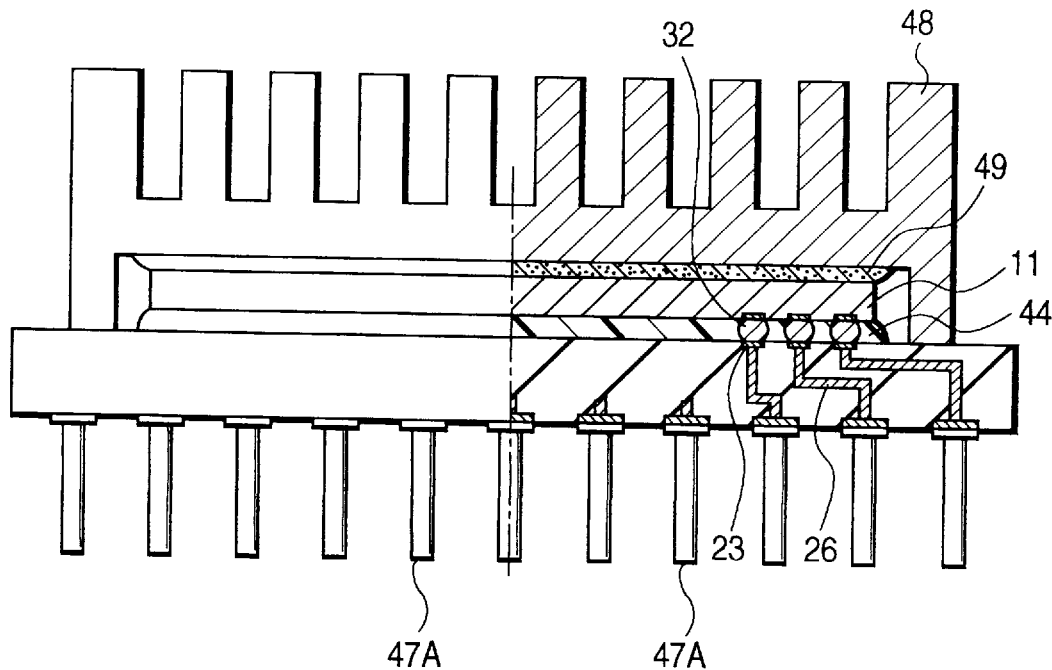
FIG. 15(a) is a front sectional view of a semiconductor device of a pin grid array package as a first embodiment of the present invention.
Figure 15B:
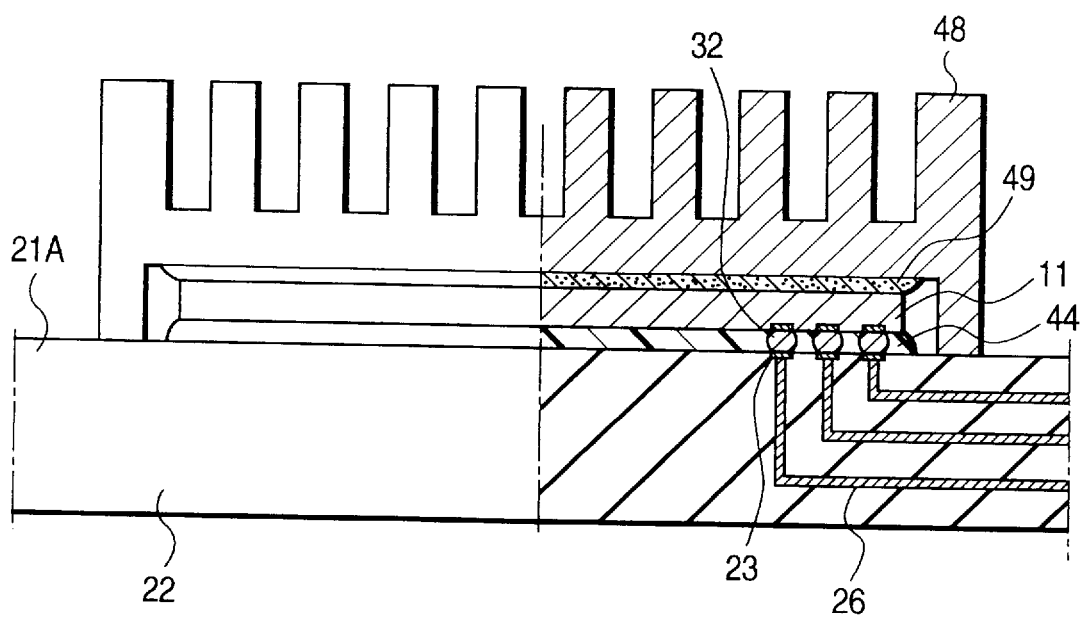
FIG. 15(b) is a front sectional view of the semiconductor device as an embodiment of the present invention mounted directly on a printed wiring board.

For instance, the package is not limited to the structure of a ball grid array, but may be constituted as shown in FIG. 15(*a*) and FIG. 15(*b*).

A semiconductor device shown in FIG. 15(*a*) is constituted as a pin grid array package and is mechanically and electrically connected with a pin 47A in place of the bump for mounting at the external terminal 27.

The semiconductor device shown in FIG. 15(*b*) employs the substrate constituted by a printed circuit board 21A, and the pellet 11 mechanically and electrically connected to the printed circuit board 21A via the connecting terminal group 32.

Although the solder bump is arranged in the pellet side in the disclosed embodiments, it may also be arranged in the substrate side. In case the solder bump is arranged in the substrate side, the solder bump forming process is shifted to the substrate fabrication process, simplifying the pellet forming process.

The base of the substrate may also be formed by, in addition to the alumina ceramics, a ceramic substrate such as silicon carbide, Mullite or aluminum nitride, and by an insulating substrate such as a glass impregnated epoxy resin substrate or the like.

The effects of the typical inventions disclosed in the present application can be simplified as follows.

On the occasion of filling the thinner space formed between the pellet and the substrate with the reinforcing resin by forming the cutout portion to the annular line group of the connecting terminals for mechanically and electrically connecting the pellet and the substrate, a reinforcing resin layer having no unfilled area can be formed for the entire part in the thinner space provided between the pellet and the substrate to thereby prevent easy generation of disconnection failures and short-circuit failures of the connecting terminals. As a result, the reliability of the package and semiconductor device can be enhanced.

What is claimed is:

1. A method of manufacturing a semiconductor device comprising the steps of:

(a) connecting a quadrangular semiconductor pellet and a printed circuit board with a plurality of bump electrodes, wherein said plurality of bump electrodes are arranged at intervals along the four sides of said semiconductor pellet, a bump electrode array is formed to surround the center area of said semiconductor pellet, and said bump electrode array has, in a part thereof, a vacant area which is wider than one of said intervals; and (b) forming a resin layer in the space between said semiconductor pellet and said printed circuit board, wherein said resin layer is formed by injection of resin material into said vacant area.

2. A method according to claim 1, wherein said resin material is an epoxy resin having a viscosity of 50 to 200 Poise at ambient temperature.

3. A method according to claim 1, wherein said vacant area is arranged at a pair of mutually-opposed sides of said semiconductor pellet.

4. A method of manufacturing a semiconductor device comprising the steps of:

(a) preparing a semiconductor pellet and a circuit board for mounting said semiconductor pellet with bump electrodes, said semiconductor pellet having an integrated circuit and external terminals formed on a main surface of said semiconductor pellet, said main surface having a quadrilateral shape, said bump electrodes being electrically connected to said external terminals and being formed on said main surface such that said bump electrodes are arranged to form a bump electrode array having plural lines of bump electrodes along four sides of said main surface and to surround a central area of said main surface in a plane, wherein said bump electrodes are arranged at equal first intervals, said bump electrode array having a vacant area which is wider than said first interval in said plane;

(b) mounting said semiconductor pellet on said circuit board via said bump electrodes; and (c) after step (b), injecting a resin material into a space between said main surface of said semiconductor pellet and said circuit board, from an outer side of said bump electrode array toward said central area of said main surface, thereby to form a resin layer in said space between said main surface of said semiconductor pellet and said circuit board.

5. A method of manufacturing a semiconductor device according to claim 4, wherein said vacant area is arranged at one of said four sides of said main surface, and wherein said resin material is injected from another one of said four sides of said main surface which is opposite to said one of said four sides of said main surface.

6. A method of manufacturing a semiconductor device according to claim 4, wherein said resin material is an epoxy resin having viscosity of 50 to 200 Poise under the normal temperature.

7. A method of manufacturing a semiconductor device according to claim 4, wherein said vacant area is arranged at one of four corners defined by said four sides of said main surface.

8. A method of manufacturing a semiconductor device according to claim 4, wherein said resin material is injected by the effect of capillarity in an area between said bump electrodes, while said resin material is injected by a pressure of injection in said central area.

* * * * *